(12) United States Patent
Darwish et al.

(10) Patent No.: US 10,529,810 B1
(45) Date of Patent: Jan. 7, 2020

(54) LATERAL SEMICONDUCTOR POWER DEVICES

(71) Applicant: MaxPower Semiconductor Inc., San Jose, CA (US)

(72) Inventors: Mohamed N. Darwish, Campbell, CA (US); Jun Zeng, Torrance, CA (US); Hamza Yilmaz, Gilroy, CA (US); Richard A. Blanchard, Los Altos, CA (US)

(73) Assignee: MaxPower Semiconductor, Inc., San Jose, CA (US)

( * ) Notice: Subject to any disclaimer, the term of this patent is extended or adjusted under 35 U.S.C. 154(b) by 215 days.

(21) Appl. No.: 15/374,875

(22) Filed: Dec. 9, 2016

Related U.S. Application Data

(60) Provisional application No. 62/266,536, filed on Dec. 11, 2015, provisional application No. 62/267,784, filed on Dec. 15, 2015, provisional application No. 62/416,645, filed on Nov. 2, 2016.

(51) Int. Cl.
*H01L 29/40* (2006.01)
*H01L 29/78* (2006.01)
*H01L 29/66* (2006.01)
*H01L 29/10* (2006.01)

(52) U.S. Cl.
CPC ........ *H01L 29/407* (2013.01); *H01L 29/1095* (2013.01); *H01L 29/66681* (2013.01); *H01L 29/7823* (2013.01)

(58) Field of Classification Search
None
See application file for complete search history.

(56) References Cited

U.S. PATENT DOCUMENTS

| 2005/0045946 | A1 | 3/2005 | Kobayashi |
| 2007/0148678 | A1 | 7/2007 | Udrea |
| 2010/0025763 | A1* | 2/2010 | Paul ............. H01L 29/0634 257/343 |
| 2011/0049616 | A1* | 3/2011 | Saggio ........... H01L 29/0634 257/329 |

(Continued)

OTHER PUBLICATIONS

KIPO International Search Report for PCT/US2016/065978, dated May 11, 2017.

(Continued)

*Primary Examiner* — Alexander G Ghyka
(74) *Attorney, Agent, or Firm* — Groover & Associates PLLC; Robert O. Groover III; Gwendolyn G. Corcoran

(57) ABSTRACT

Methods and systems for lateral power devices, and methods for operating them, in which charge balancing is implemented in a new way. In a first inventive teaching, the lateral conduction path is laterally flanked by regions of opposite conductivity type which are self-aligned to isolation trenches which define the surface geometry of the channel. In a second inventive teaching, which can be used separately or in synergistic combination with the first teaching, the drain regions are self-isolated. In a third inventive teaching, which can be used in synergistic combination with the first and/or second teachings, the source regions are also isolated from each other. In a fourth inventive teaching, the lateral conduction path is also overlain by an additional region of opposite conductivity type.

20 Claims, 41 Drawing Sheets

(56) References Cited

U.S. PATENT DOCUMENTS

| | | | | |
|---|---|---|---|---|
| 2012/0094457 A1* | 4/2012 | Gabrys | ............... | H01L 29/0653 |
| | | | | 438/286 |
| 2013/0092977 A1 | 4/2013 | Huesken et al. | | |
| 2013/0256747 A1 | 10/2013 | Sin et al. | | |
| 2015/0004768 A1* | 1/2015 | Yang | .................... | H01L 29/063 |
| | | | | 438/286 |
| 2015/0008481 A1 | 1/2015 | Pathirana et al. | | |
| 2016/0172452 A1* | 6/2016 | Darwish | ............... | H01L 29/408 |
| | | | | 257/339 |

OTHER PUBLICATIONS

KIPO Written Opinion of the International Searching Authority for PCT/US2016/065978, dated May 11, 2017.

\* cited by examiner

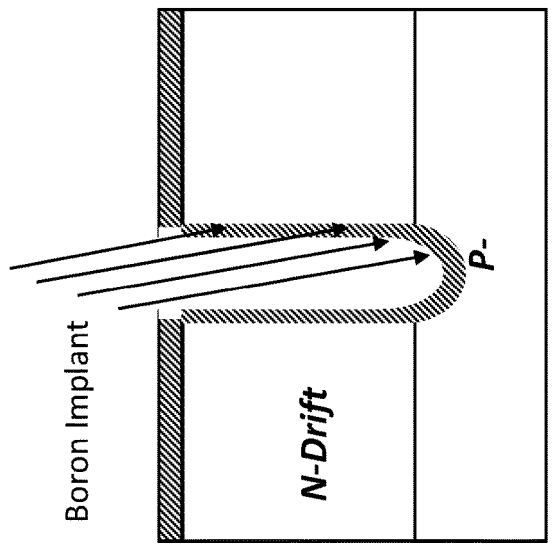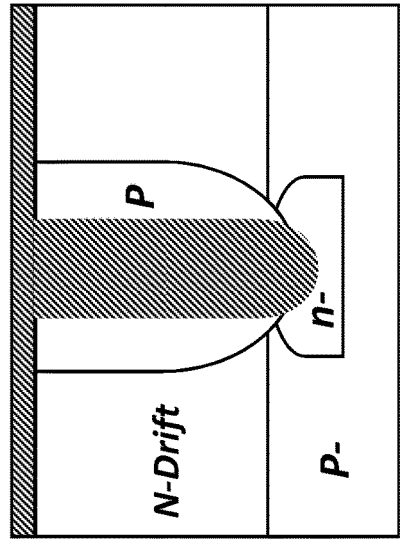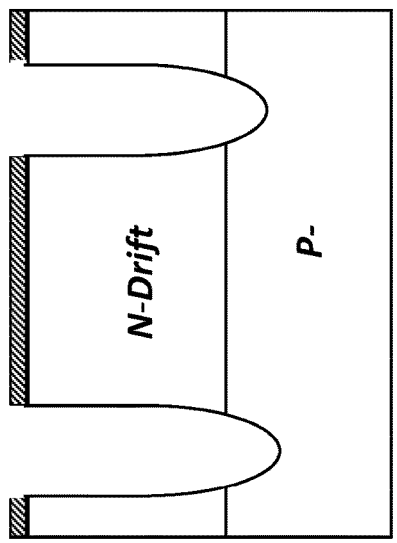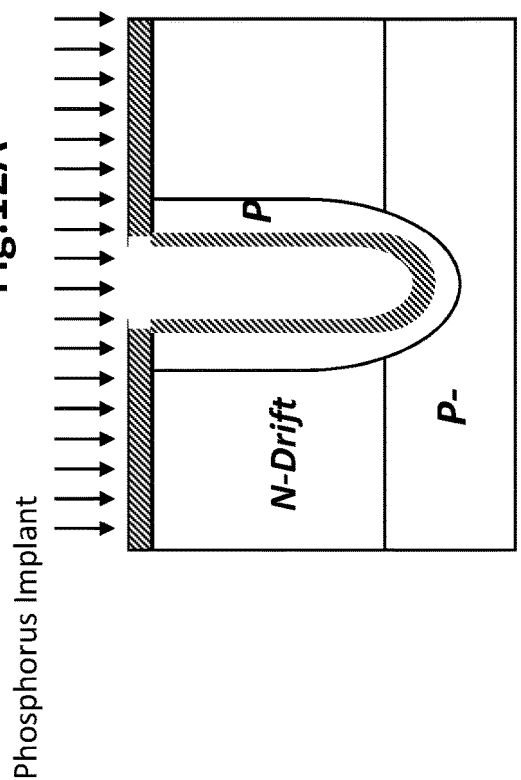

LATERAL SEMICONDUCTOR POWER DEVICES

CROSS-REFERENCE

Priority is claimed from U.S. provisional applications 62/266,536 filed Dec. 11, 2015, 62/267,784 filed Dec. 15, 2015, and 62/416,645 filed Nov. 2, 2016, all of which are hereby incorporated by reference.

BACKGROUND

The present application relates to lateral power devices.

Note that the points discussed below may reflect the hindsight gained from the disclosed inventions, and are not necessarily admitted to be prior art.

Power MOSFETs are widely used as switching devices in many electronic applications. In order to minimize conduction power loss it is desirable that power MOSFETs for a given breakdown voltage have low specific on-resistance. Specific on-resistance (Rsp) is defined as the on-resistance area product (Ron*A). There is a need for new structures in order to meet the increasing requirement of reduced Rsp for many new applications. Lateral power MOSFET structures are required in many applications that require the monolithic integration of one or more MOSFET in addition to other circuit components.

The present application discloses a number of lateral power semiconductor structures and methods of fabrication utilizing charge balance techniques to achieve high breakdown voltage. The new structures have several advantages over the state of the art devices in particular having low specific on-resistance Rsp, more cost effective and compatible with conventional termination structures such as Field Plates, Guard Rings or Junction Termination Extension (JTE).

The present application teaches, among other innovations, lateral power devices, and methods for operating them, in which charge balancing is implemented in new ways. In a first inventive teaching, the lateral conduction path is laterally flanked by regions of opposite conductivity type which are self-aligned to isolation trenches. In a second inventive teaching, which can be used separately or in synergistic combination with the first teaching, the drain regions are self-isolated. In a third inventive teaching, which can be used separately or in synergistic combination with the first and/or second teachings, the source regions are also isolated from each other. In a fourth inventive teaching, the lateral conduction path is also overlain by an additional region of opposite conductivity type.

BRIEF DESCRIPTION OF THE DRAWINGS

The disclosed inventions will be described with reference to the accompanying drawings, which show important sample embodiments and which are incorporated in the specification hereof by reference, wherein:

FIGS. 12A-12D show an example of process steps in a sample implementation.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

This application discloses a number of lateral power semiconductor structures and methods of fabrication utilizing charge balance (PN Superjunction) and/or permanent charge techniques to achieve high breakdown voltage. The new structures have several advantages over the state of the art devices in particular having low specific on-resistance Rsp, are more cost effective and are compatible with conventional termination structures such as Field Plates, Guard Rings or Junction Termination Extension (JTE).

Figure 1A:
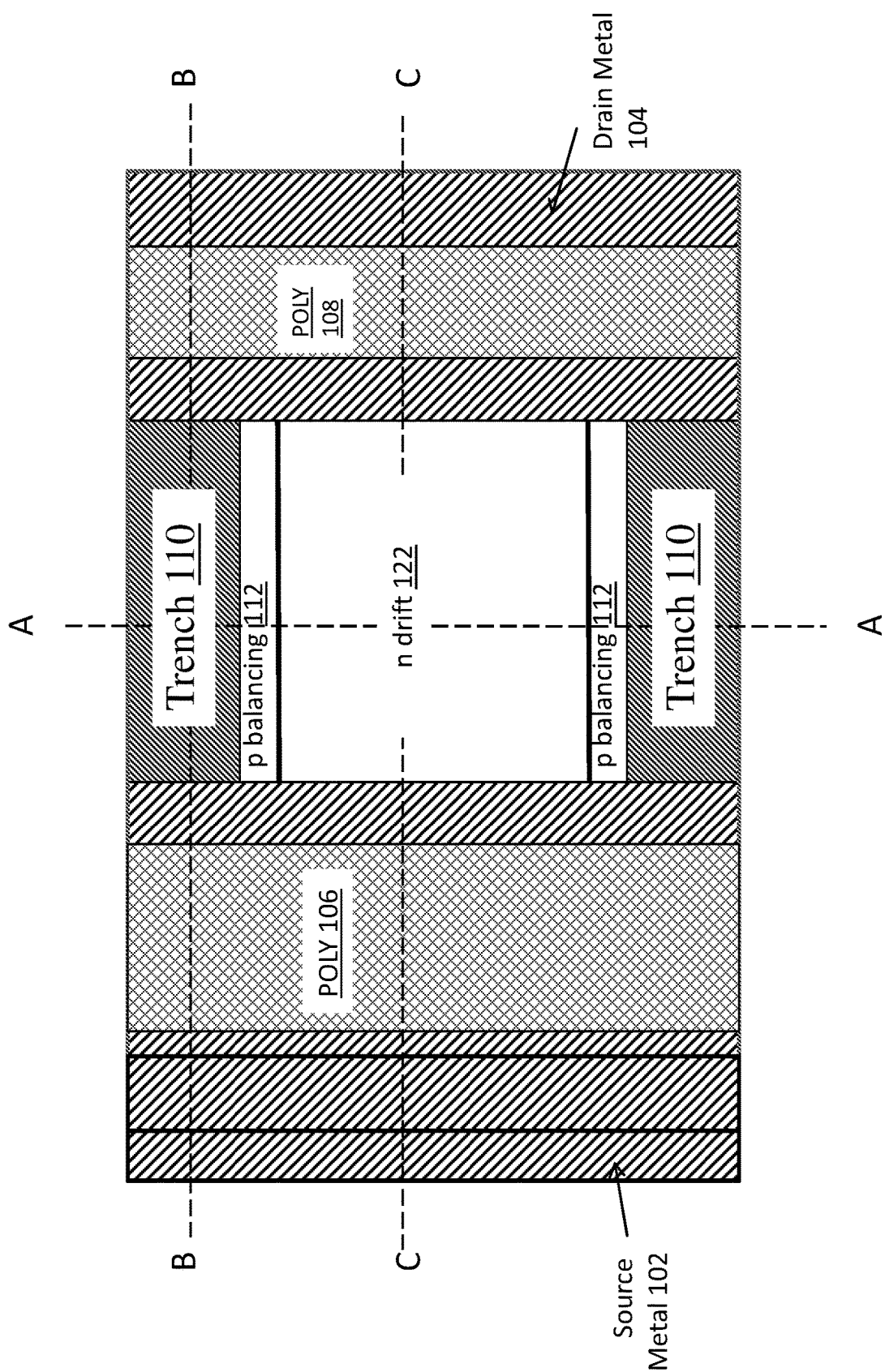
FIG. 1A shows one embodiment of a lateral n-channel MOSFET transistor with the source, gate and drain terminals are accessible at the device surface.

FIG. 1A shows one embodiment of the invention of the top view of a lateral n-channel MOSFET transistor with the source metal 102, gate 106, and drain metal 104, all accessible at the device surface. Also visible are a field plate 108, the location of the drift region 122, and two trenches 110 which laterally flank the drift region.

Figure 1B:
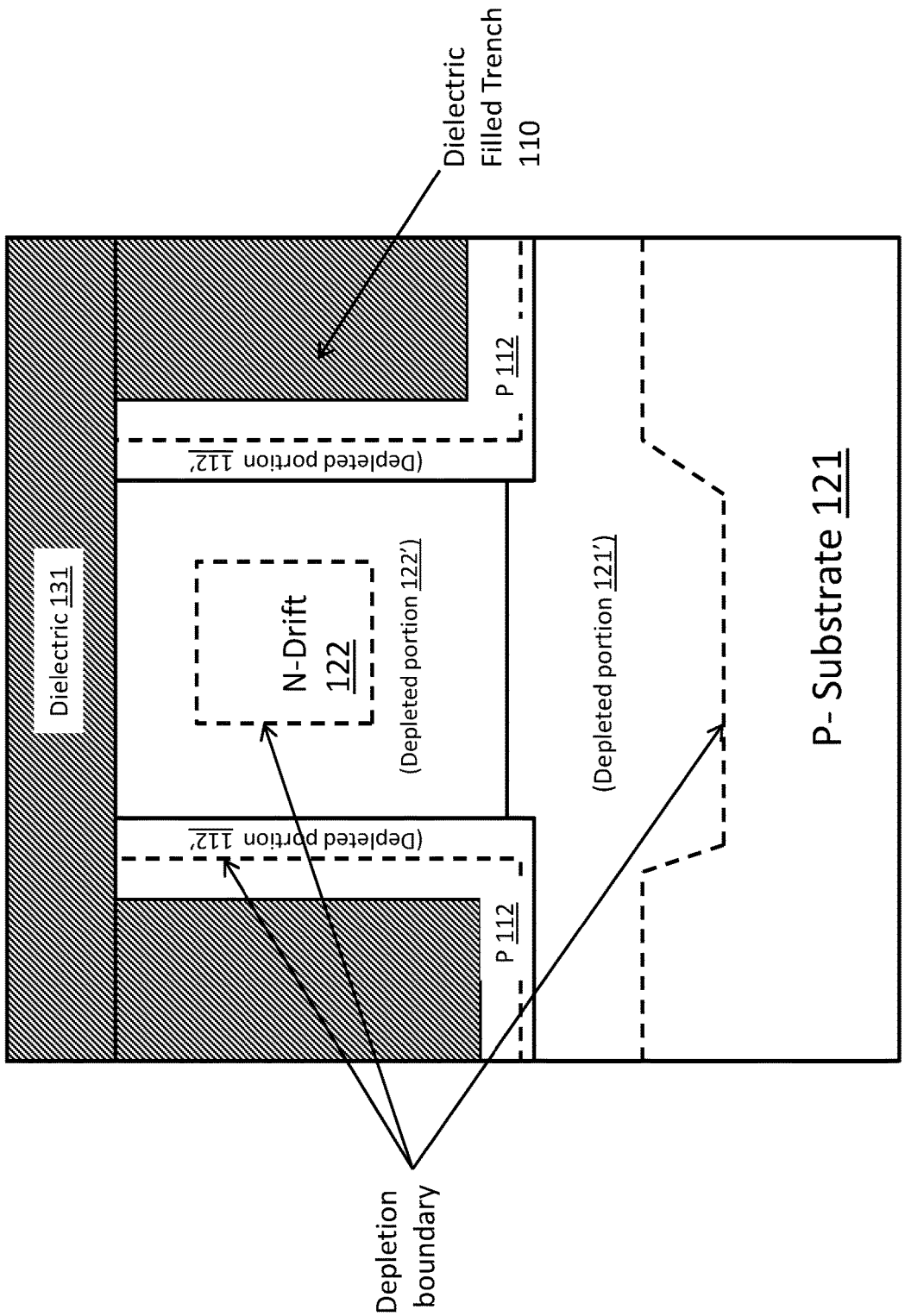
FIGS. 1B, 1C, and 1D show cross-sections of this device.

FIG. 1B shows the cross section along the line A-A of the device shown in FIG. 1A. As shown, the device has a P-type substrate 121, the N-type drift region 122, trenches 110 filled with a dielectric material such as silicon dioxide $SiO_2$ (oxide), and a P-type charge-balancing region 112 adjacent the sidewalls of trenches 110. An overlying dielectric layer 131, e.g. of oxide, is also shown.

The N-type drift region 122 is implanted and driven to the required junction depth before etching the trench. Alternatively, the drift region 122 can be implanted after trench etching using tilt angle implant or using techniques such as plasma immersion ion implantation through the trench sidewalls (and subsequently diffused). The P-type charge-balancing region 112, in this example, is implanted (after etching the trench) through the trench sidewalls (and subsequently diffused). The depth of trenches 110 can be for example 5 to 20 microns. The N-type drift region 122 and the P-type charge-balancing region 112 are designed, in relation to their doping concentration, width and thickness, such that these two layers are both fully depleted at breakdown voltage. This helps to provide a uniform electric field distribution and higher breakdown voltage. Having both the N-type drift region 122 and P-type region 112 implanted results in a more precise charge balance control which is required for any charge balanced devices. Using a P− substrate without the need for an epitaxial layer results in a lower cost process and is compatible with conventional CMOS processes. Specific examples will be given below.

The P-substrate doping is chosen to support the required breakdown voltage, for example 700V.

FIG. 1B also shows representative depletion boundaries in the P, N-drift and P-substrate regions. For clarity, this is shown under less than full voltage in the OFF state; however, it is preferred that the P-type charge-balancing region 112 and N-type drift region 122 both be fully depleted at breakdown voltage. In N-type drift region 122, the depleted portion 122' will have a positive space charge. Since the mobile electrons have been expelled, the immobile ionized dopant atoms, e.g. donor species such as arsenic or phosphorus, will have a net positive charge. Similarly, in the P-type charge-balancing regions 112, and in the P-type substrate 121, the depleted portions 112' and 121' will have a negative space charge. (Since the mobile holes have been expelled, the immobile ionized acceptor dopant atoms, e.g. boron, will have a net negative charge.)

Figure 1C:
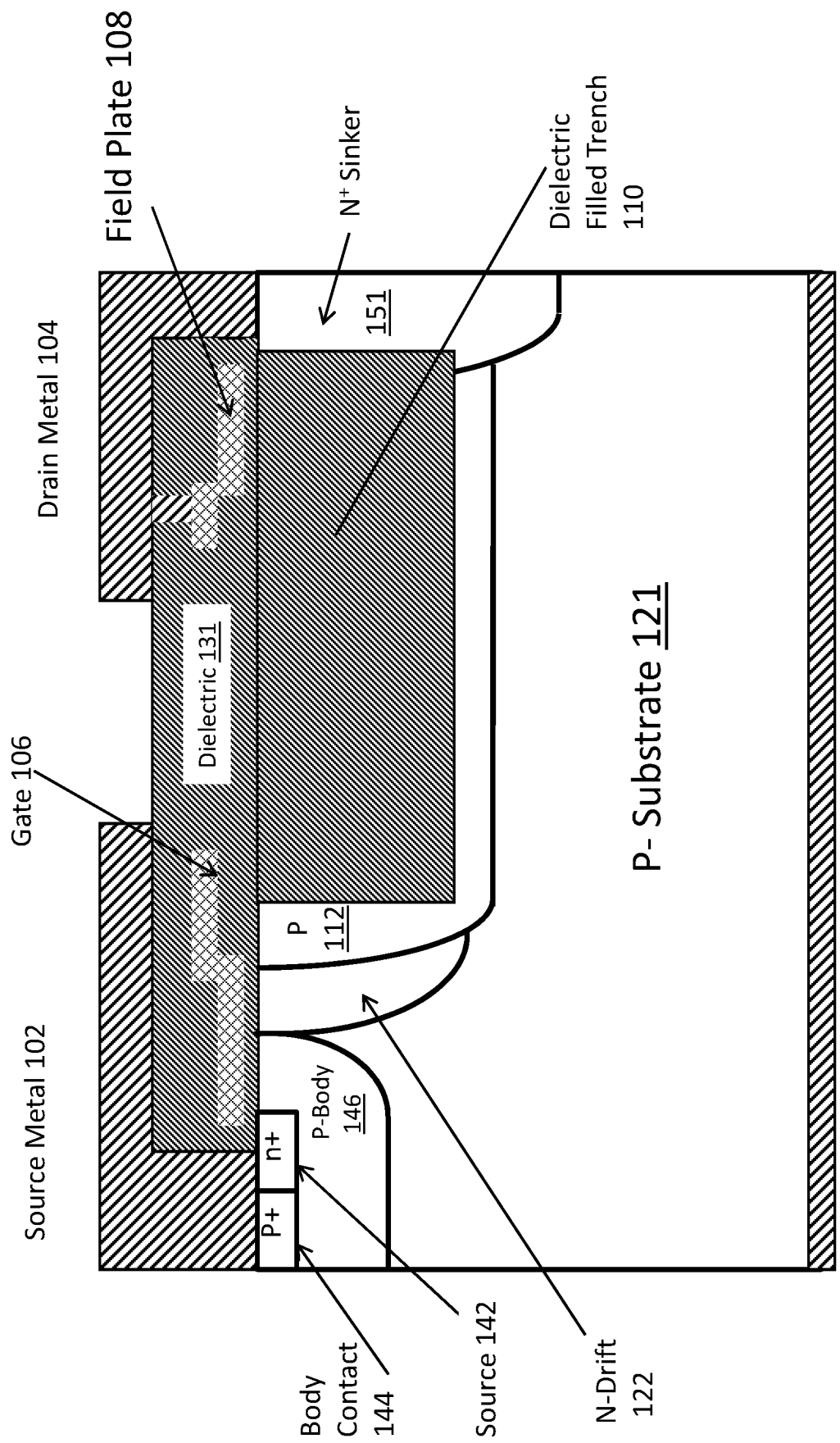

FIG. 1C shows a cross section along the line B-B of the device shown in FIG. 1A. This Figure shows a planar gate structure, including an n+ source region 142, P-type body 146, and p+ body contact region 144. The p+ body contact 144 can be planar or can be made using a shallow trench contact. The trench 110 is filled with a dielectric material such as silicon dioxide. A polysilicon gate electrode 106 with stepped oxide thickness is used, and, in combination with the source metal 102, forms a field plate. An important feature of this structure is that the N-Drift region 122 overlaps the total or entire width of the gate electrode 106 at the P-body 146 and N-drift 122 interface. This provides an efficient spreading path for the electron current flowing from the channel into the N-drift layer 122; the current spreads both laterally and vertically which results in a low Rsp. A deep N+ sinker 151 at the drain is used to collect the electron current to lower the on resistance. At the drain contact a polysilicon layer, which is connected to the drain metal, is used as a field plate to reduce the electric field.

Figure 1D:
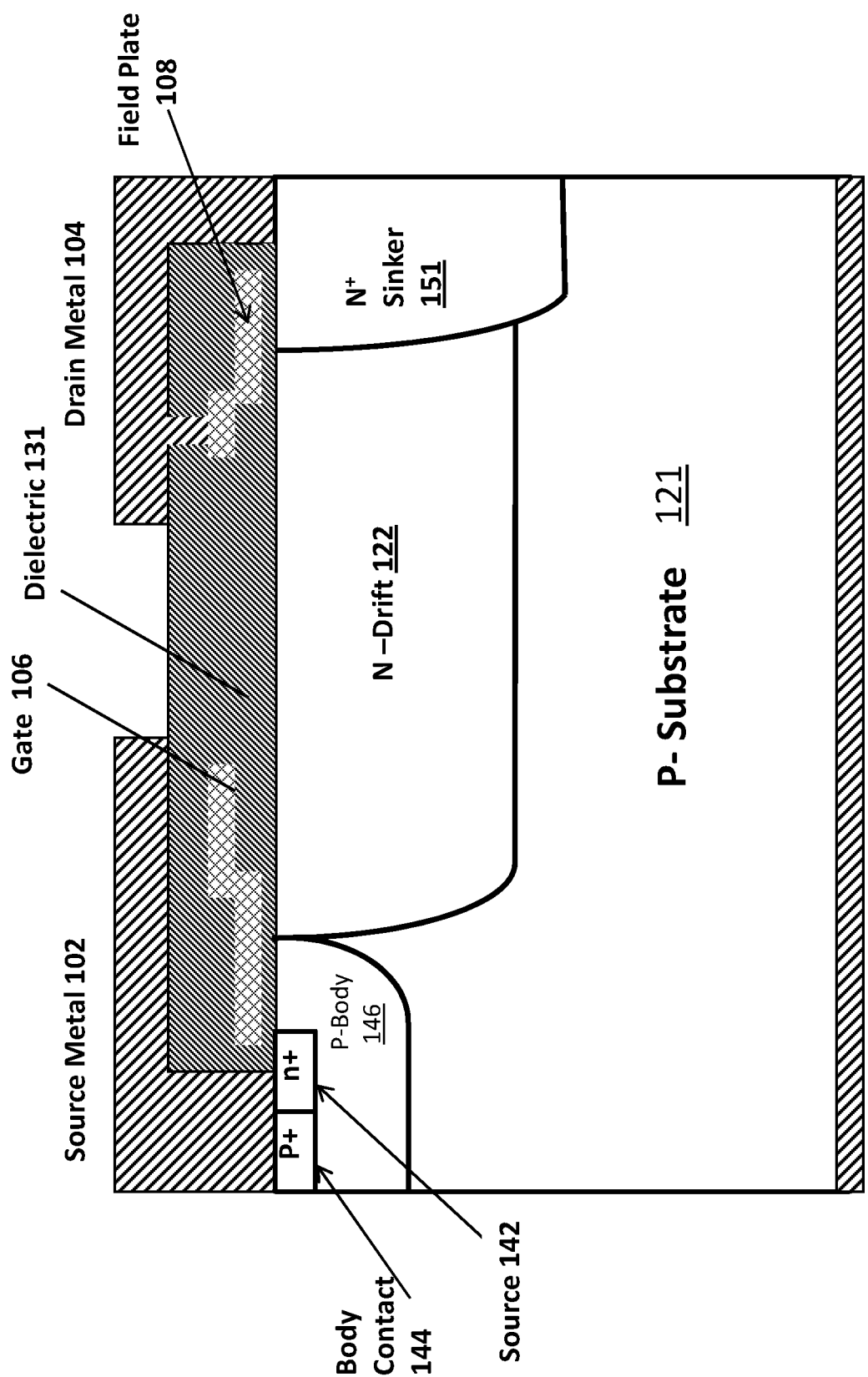

FIG. 1D shows a cross section along the line C-C of the device shown in FIG. 1A. This Figure shows the n+ source 142, P-type body region 146 (in which a channel is formed by inversion when the device is turned on), polysilicon gate electrode 106, N-type drift region 122, and deep N+ sinker region 151 which connects to drain metal 104. Note that in this embodiment the charge-balancing region 112 extends below the trench 110, as well as laterally adjacent to it.

For the specific example of a 700V voltage rating, the above relations can be implemented, for example, with the following dimensions and dopings:

Substrate 121: doped to e.g. about 3E14 (i.e. $3 \times 10^{14}$) $cm^{-3}$ with boron Body 146: doped with boron to a peak concentration of e.g. about $1 \times 10^{17}$ $cm^{-3}$.

Drift 122: e.g. 7 microns deep, implanted at e.g. $3-6 \times 10^{12}$ $cm^{-2}$ with Phosphorus.

Charge-balancing regions 112: e.g. about 1-2 microns thick, implanted at e.g. $1-2 \times 10^{12}$ $cm^{-2}$ with boron.

Figure 1E:
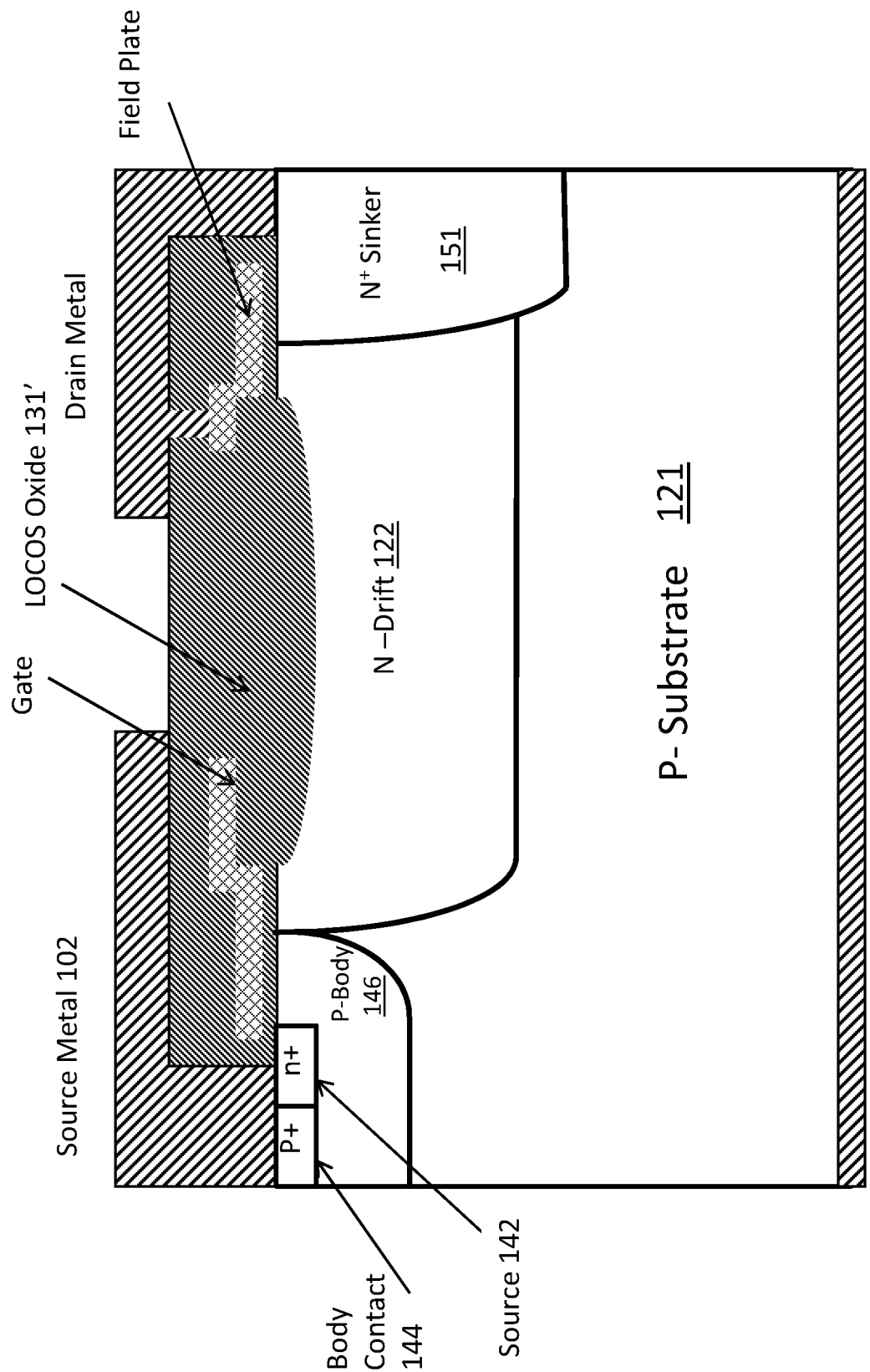
FIG. 1E shows a cross section of an alternative device.

FIG. 1E shows a cross section of an alternative structure along the line C-C of the device shown in FIG. 1A. The structure shown FIG. 1E is similar to that shown in FIG. 1D except that a Local Oxidation (LOCOS) process is used to form a partly recessed field oxide 131' which extends below the silicon surface.

Figure 1F:
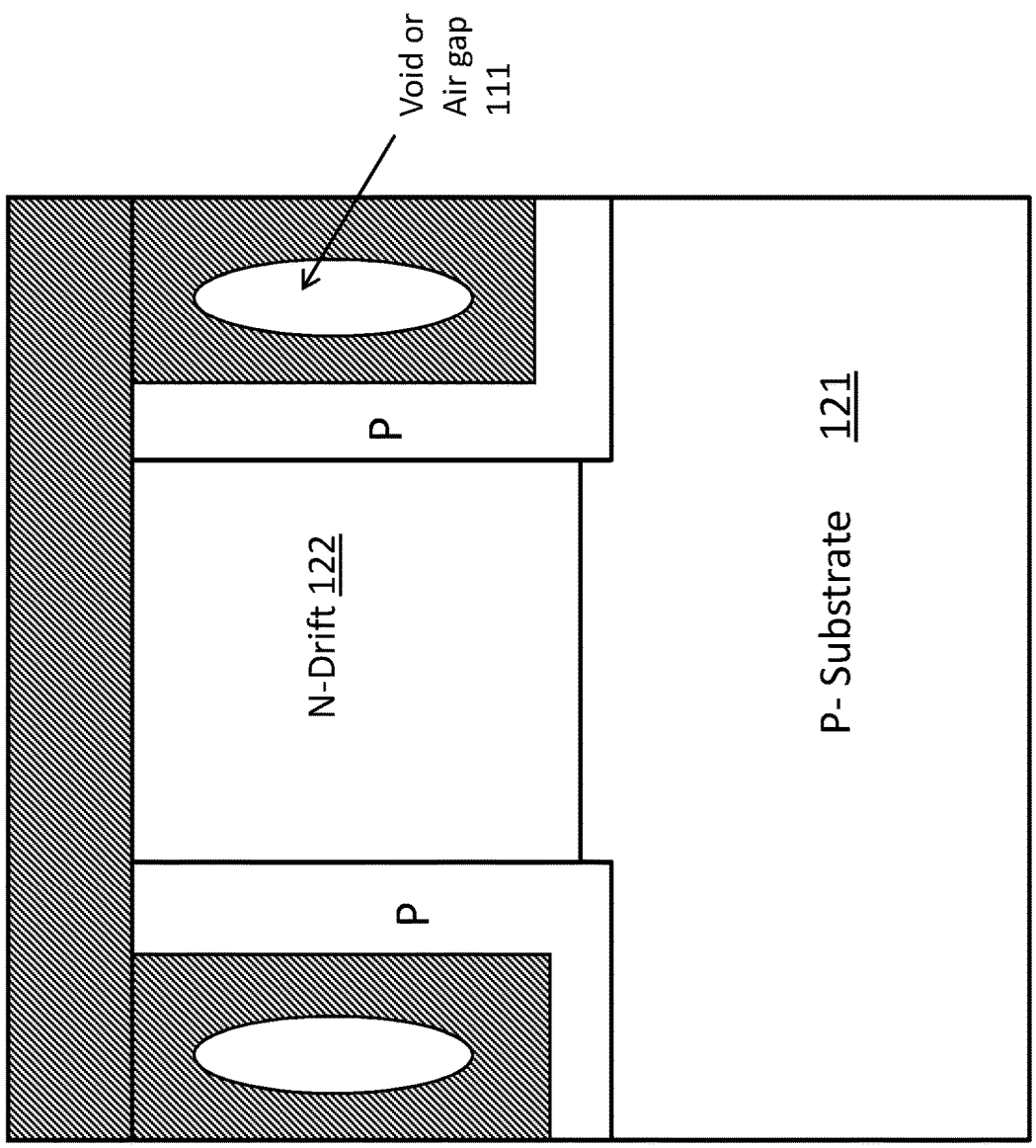
FIG. 1F shows a cross section of another alternative device.

FIG. 1F shows a cross section of an alternative structure along the line A-A of the device shown in FIG. 1A. The structure shown in FIG. 1F is generally somewhat similar to that shown in FIG. 1D, except that the trenches 110 are not completely filled with dielectric material and include voids or air gaps 111.

Figure 2A:
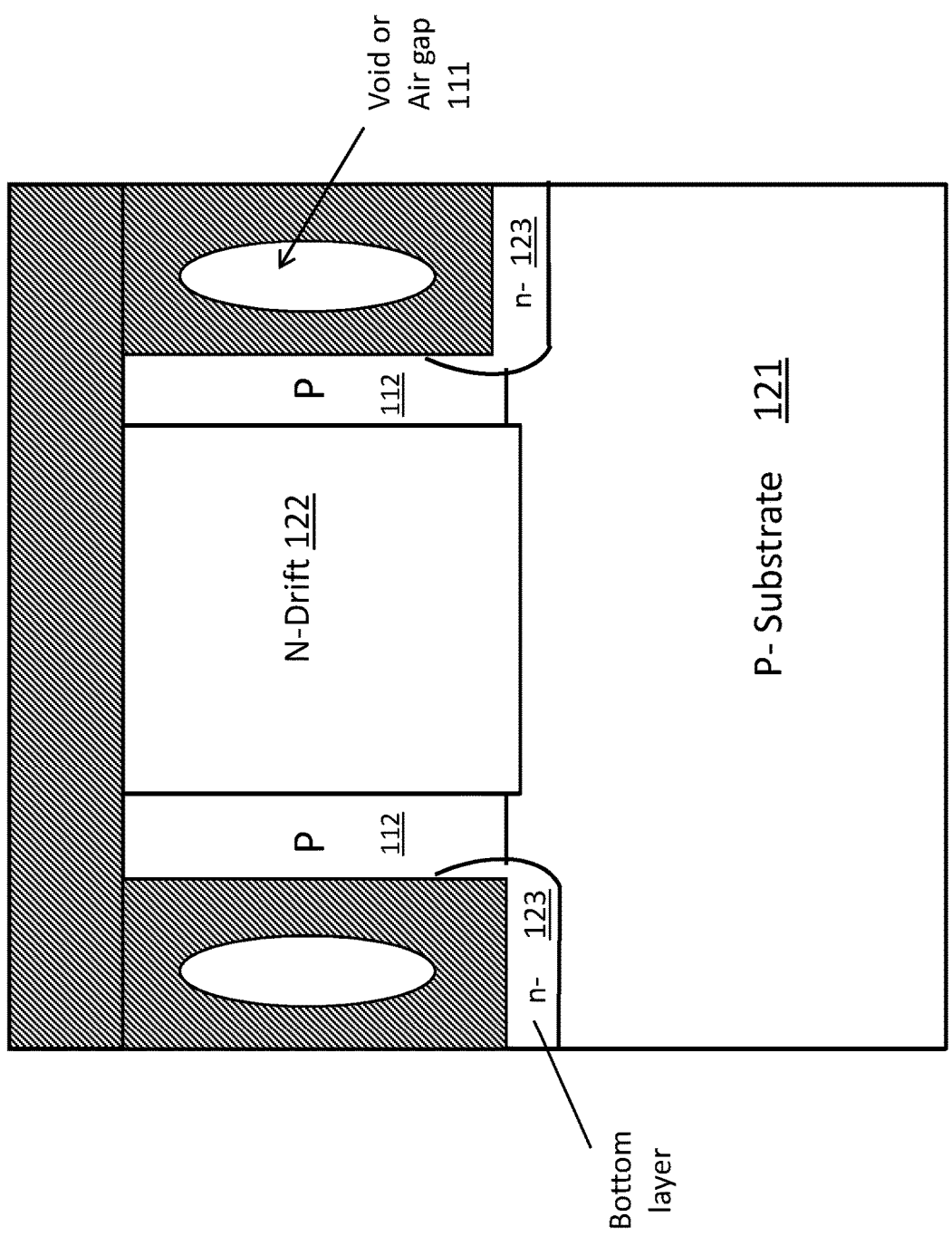
FIGS. 2A and 2B shows another innovative structure.
Figure 2B:
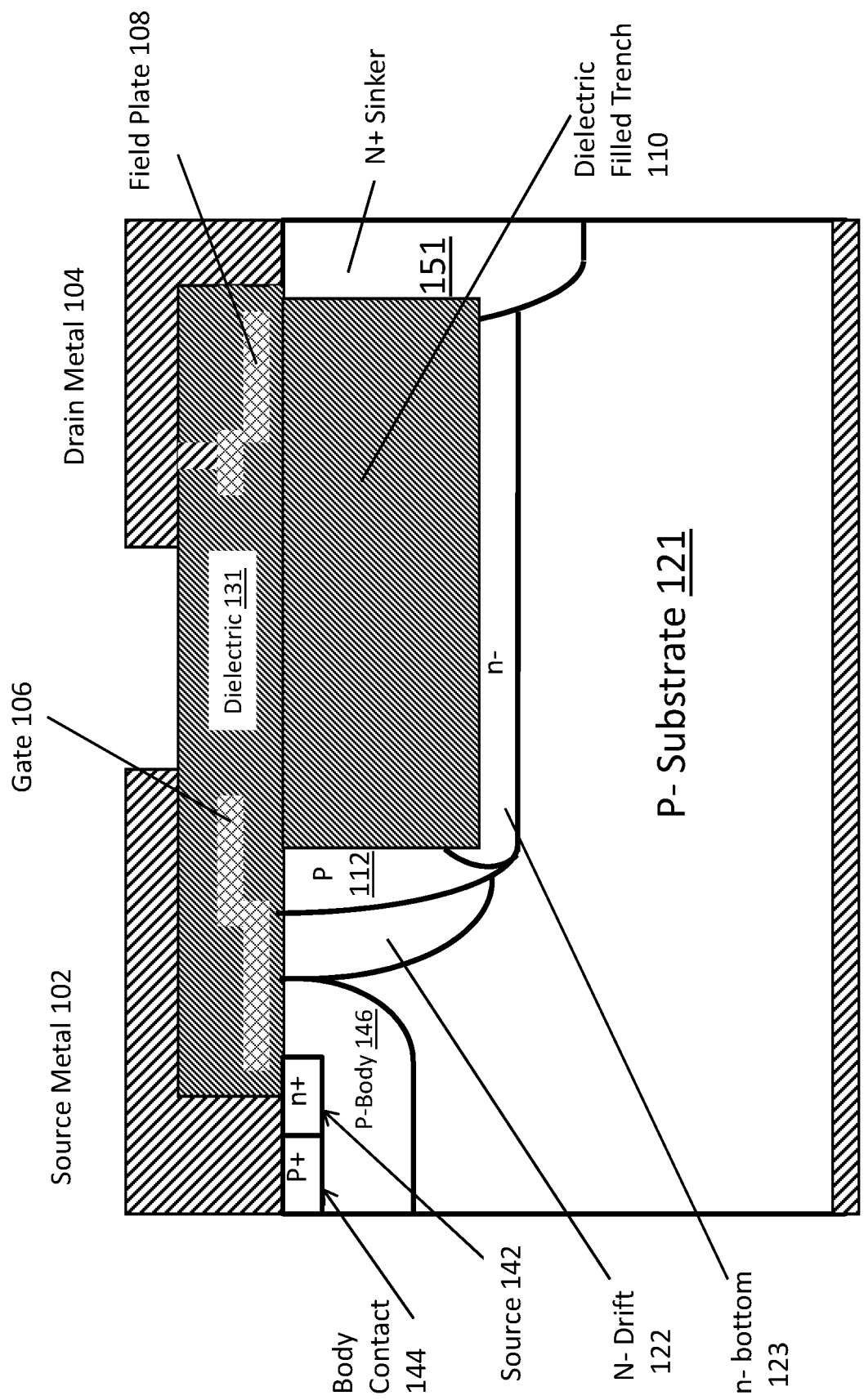

FIGS. 2A and 2B show another innovative structure, which is generally somewhat similar to that shown in FIGS. 1B and 1C, but which also has an n-type bottom region 123 generally underlying the bottom of the trench. The process window to achieve charge balance in superjunction devices in production is tight. This effect is more challenging in lateral superjunction devices due to the charge sharing effect of the P-substrate since its depletion charge varies laterally along the N-drift region. Having the n-type trench bottom layer 123 provides a way to alleviate this three-dimensional problem by separating the charge at trench sidewalls and trench bottom. The doping of n-type region 123 is adjusted such that at breakdown voltage it is fully depleted with uniform electric field along its length, to maximize the charge balance process control window.

Figure 3A:
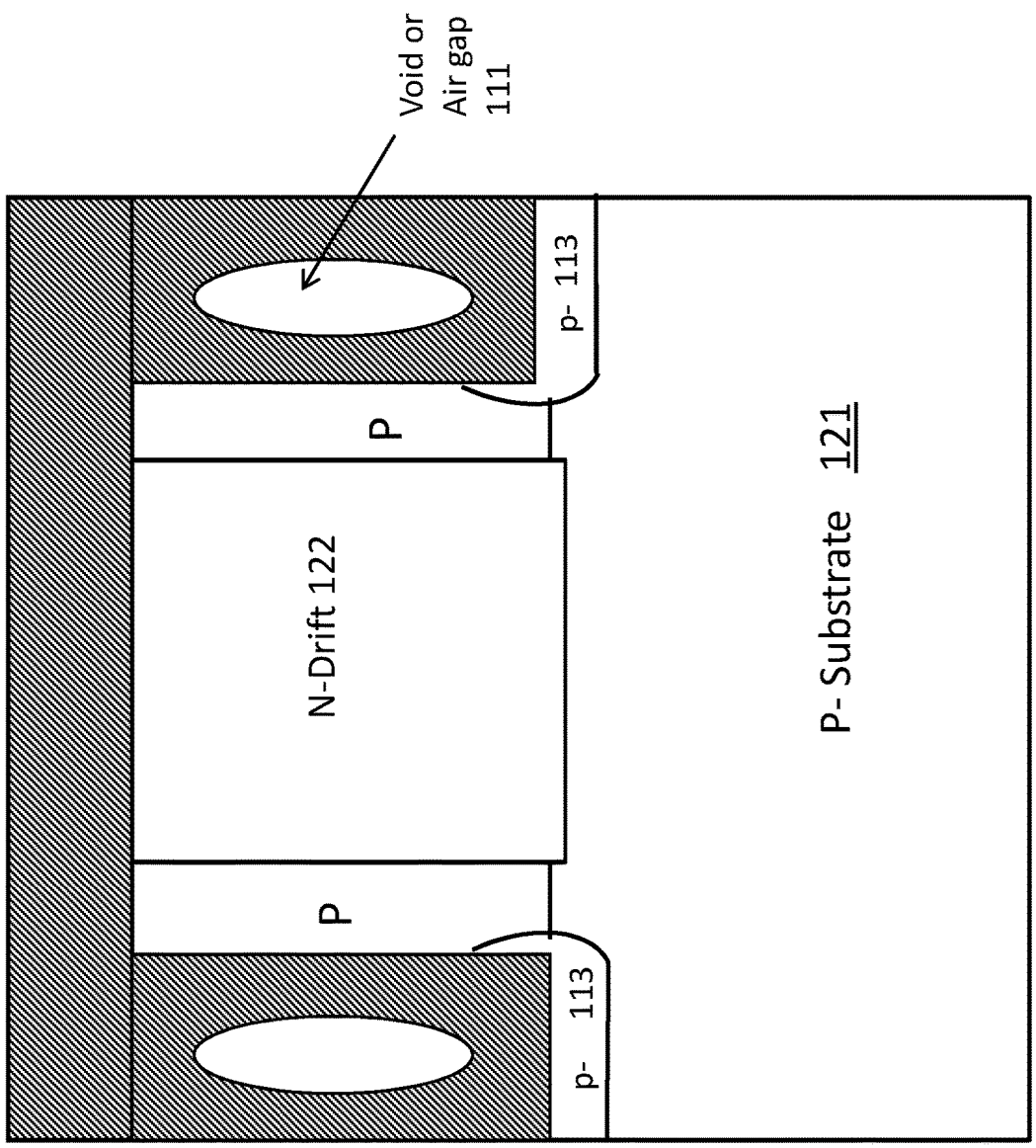
FIGS. 3A and 3B show another innovative structure.
Figure 3B:
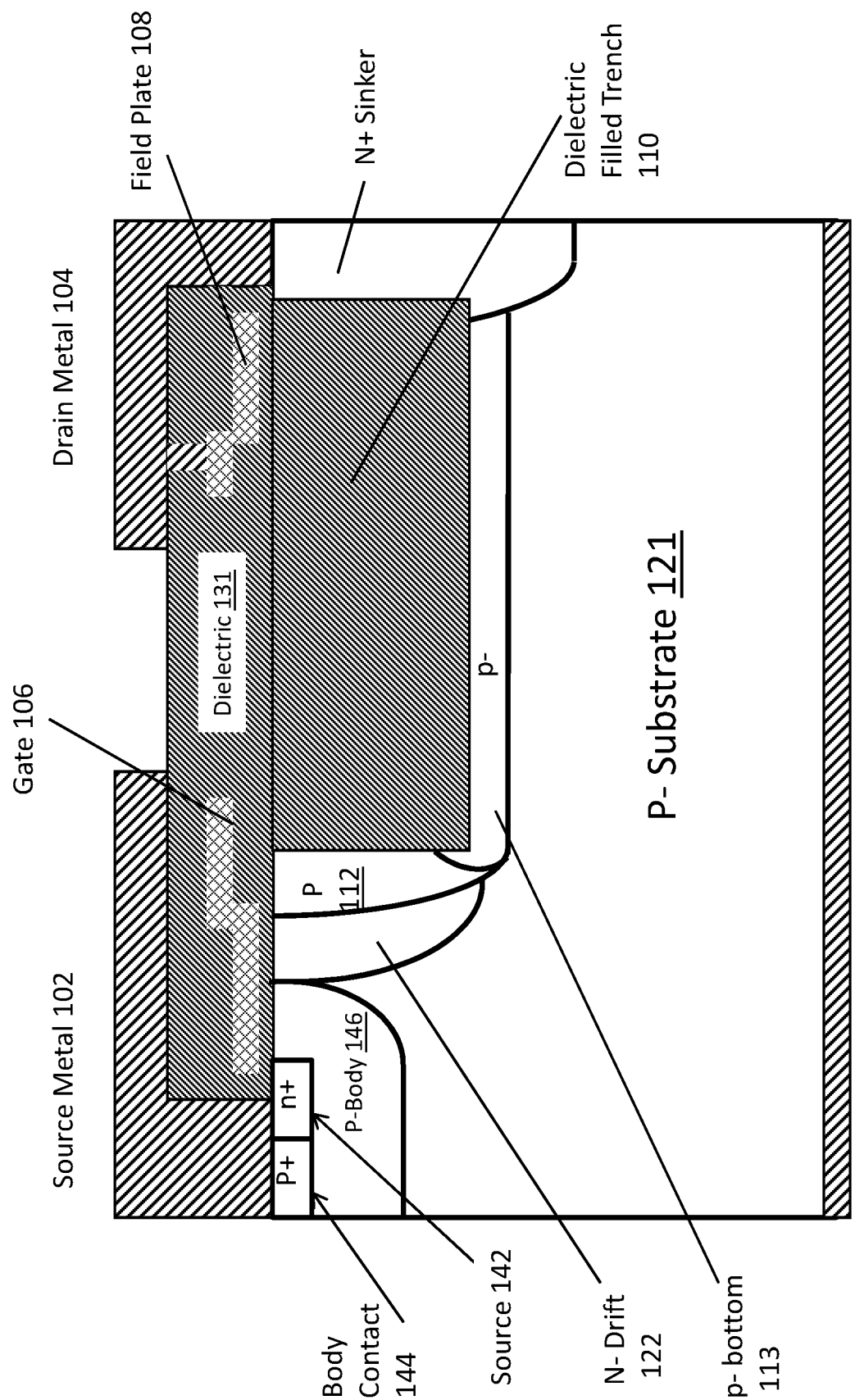

FIGS. 3A and 3B show another innovative structure, which is generally somewhat similar to that shown in FIGS. 1B and 1C, but which also has a p-type region 113 at the bottom of the trench. The doping of P-type balancing region 112 is preferably less than that of the p-type trench bottom region 113. Similarly the trench bottom p-type 113 is adjusted such that at breakdown voltage it is fully depleted with a uniform electric field along its length to maximize the charge balance process control window.

Figure 4:
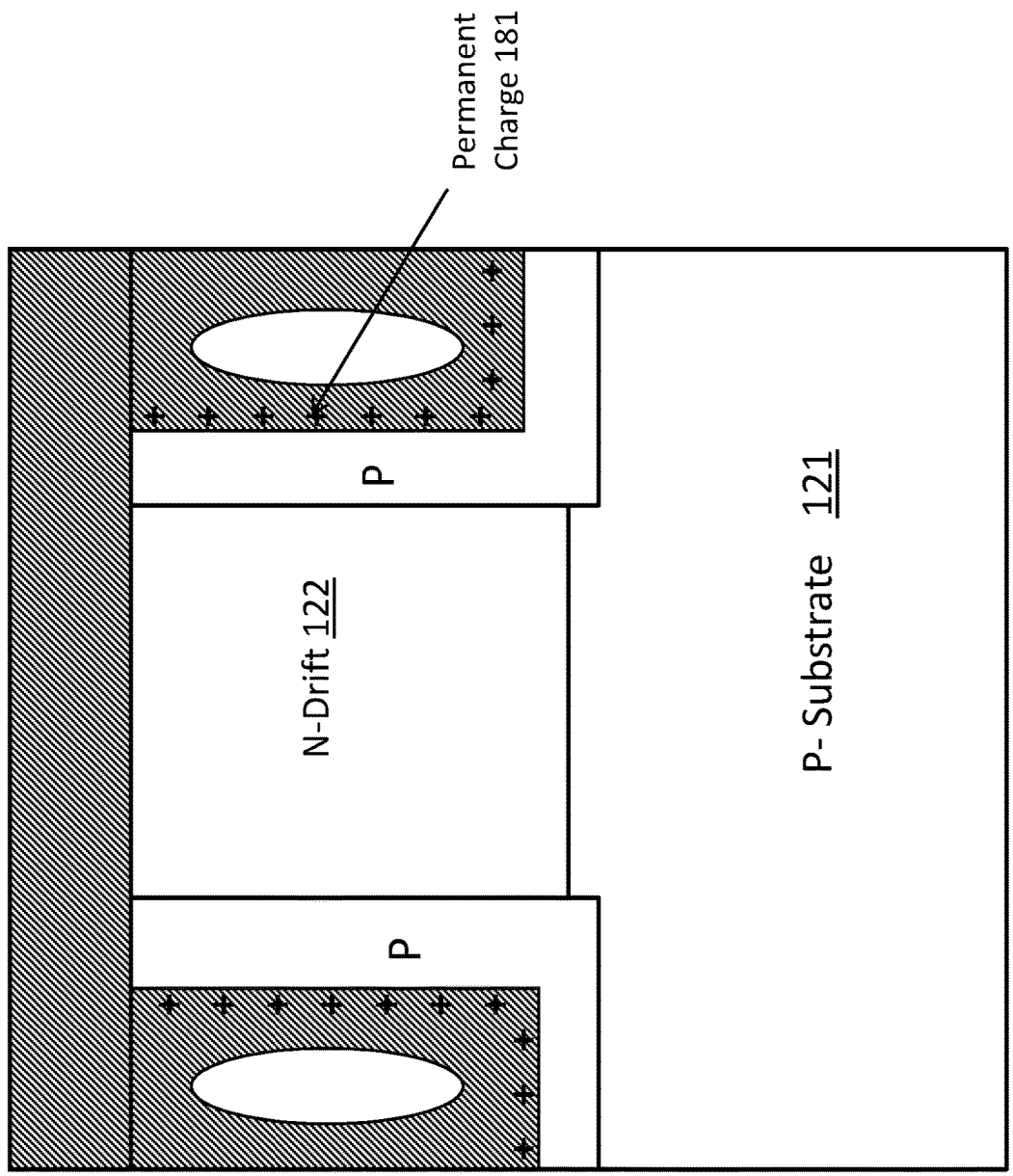
FIG. 4 shows a cross section of another alternative device.

FIG. 4 shows another embodiment where permanent charge 181 (positive in this example, and created for example at the silicon-silicon oxide interface, for example by implanting cesium ions) creates an electron inversion layer in the silicon along the trench sidewalls, which provides another path to conduct current in the on-state, and therefore results in further reduction in $R_{sp}$.

Note that, in this case, the Cs+ ions will increase the charge imbalance, so the total doping of the p-type charge balancing region 112 is preferably increased to e.g. about 2E12 $cm^{-2}$.

The devices shown in FIGS. 1-4 have the advantages of providing low Rsp by using charge balance techniques to permit increasing the doping concentration of the N-drift. Furthermore, the need for an expensive epitaxial layer is avoided by the innovative combination of diffused and implanted N-drift, P-layer, and N+ sinker. This provides a very cost effective structure and process.

Figure 5:
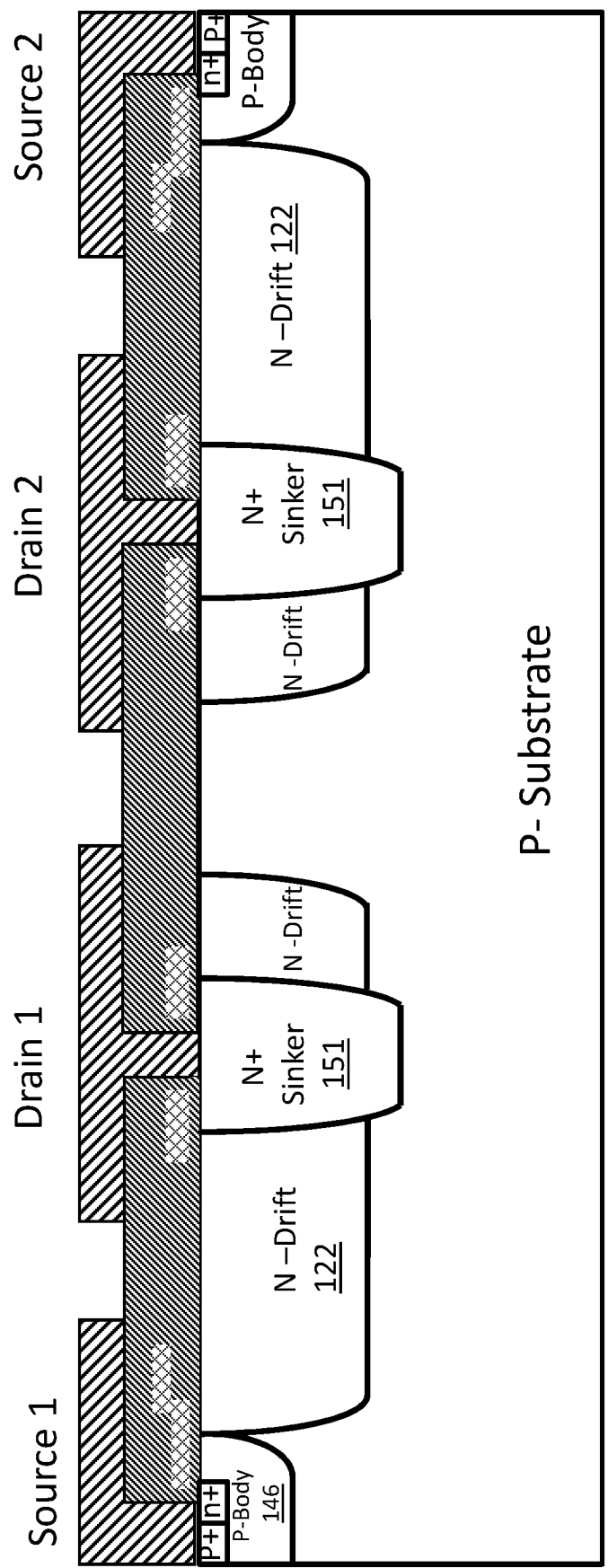
FIG. 5 shows integration of multiple power devices on a single die.

In addition, the devices shown in FIGS. 1-4 have self-isolated drains, so that multiple MOSFET devices can be integrated on the same substrate with different drain terminals without the need for additional isolation between them. An example of this is shown in FIG. 5. This Figure (not to scale) shows (in a sectional view) integration of two different power MOSFETs on a single die. The two MOSFETs each have their own separate drain contacts (Drain1 and Drain2), which can be at different potentials. The drain junctions are isolated as a result of the junction between the N+ sinker (N-drift) and the P-type substrate. This significantly simplifies the integrated structure and reduces its cost. This is not limited to just two power MOSFETs, but can include any number of additional power MOSFETs. Preferably each of the power MOSFETs includes charge balancing regions adjacent to the lateral channel, as described herein.

Figure 6:
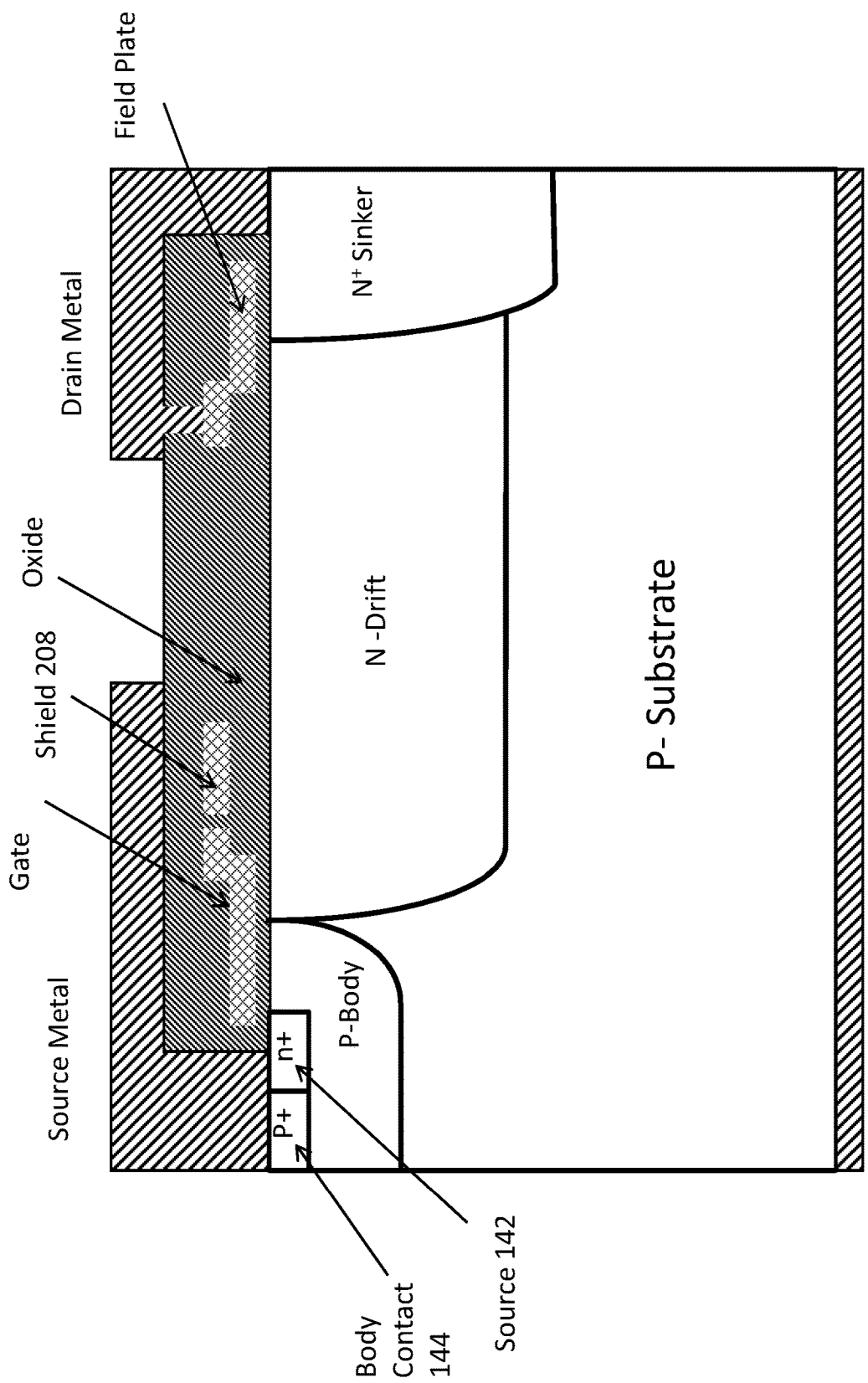
FIG. 6 shows a cross section of another alternative device.

FIG. 6 shows another innovative structure. It is generally somewhat similar to that shown in FIG. 1D, except that this structure includes a shield electrode 208 (which is preferably connected to the source electrode). This shield electrode reduces the gate-drain capacitance $C_{gd}$ (or equivalently the gate-drain charge $Q_{gd}$), which is an important requirement for high switching speed applications.

Figure 7A:
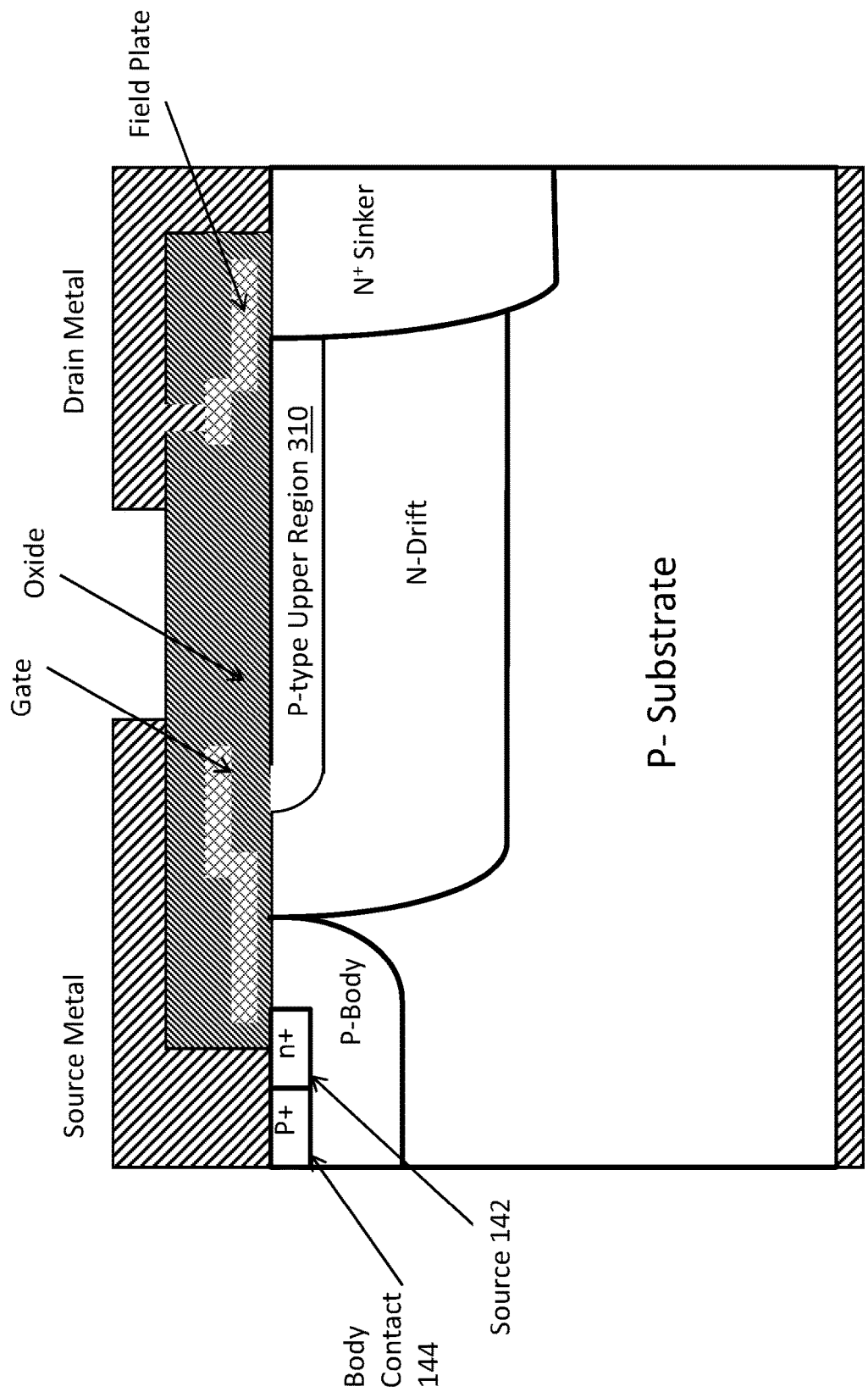
FIGS. 7A and 7B show another innovative structure.
Figure 7B:
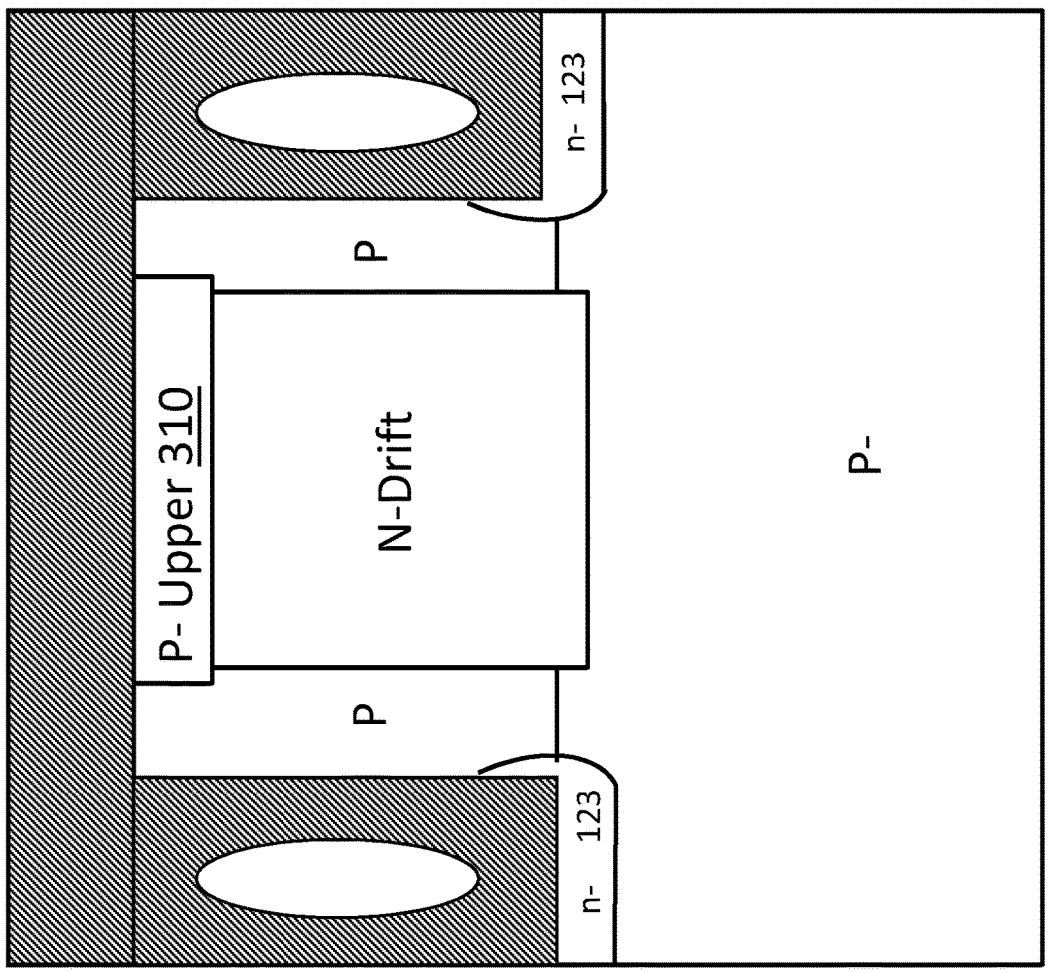

FIGS. 7A and 7B show another innovative structure, which is generally somewhat similar to that shown in FIGS. 1D and 1F, but which also has a P-type surface region 310. This region too provides a space charge (under reverse bias) which balances the space charge of the drift region. In this innovation, a cross-section of the n-type drift region is surrounded on all four sides by p-type charge balancing material. This provides additional charge in the drift region while preserving the charge balance at breakdown voltage. This allows for increased N-drift doping concentration without lowering the breakdown voltage. This results in a further reduction in Rsp. The p-surface layer is connected to the P-body/p+ source contact at certain locations of the device that is not shown in the figure. The doping in the region 310 is, in this example, about $1-2 \times 10^{12}$ cm$^{-2}$.

Figure 8A:
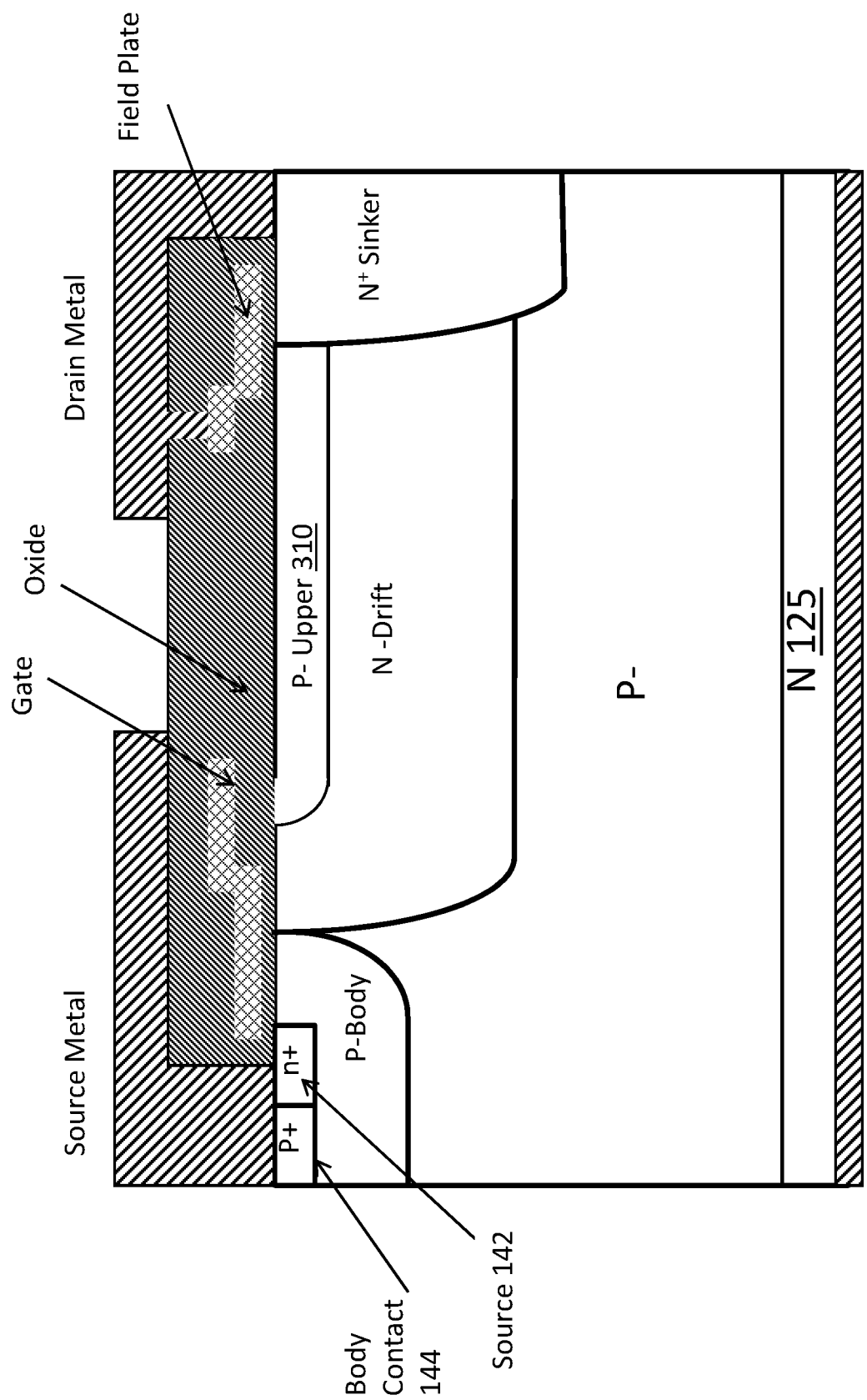
FIGS. 8A and 8B show another innovative structure, with isolated source terminals from the substrate terminal.
Figure 8B:
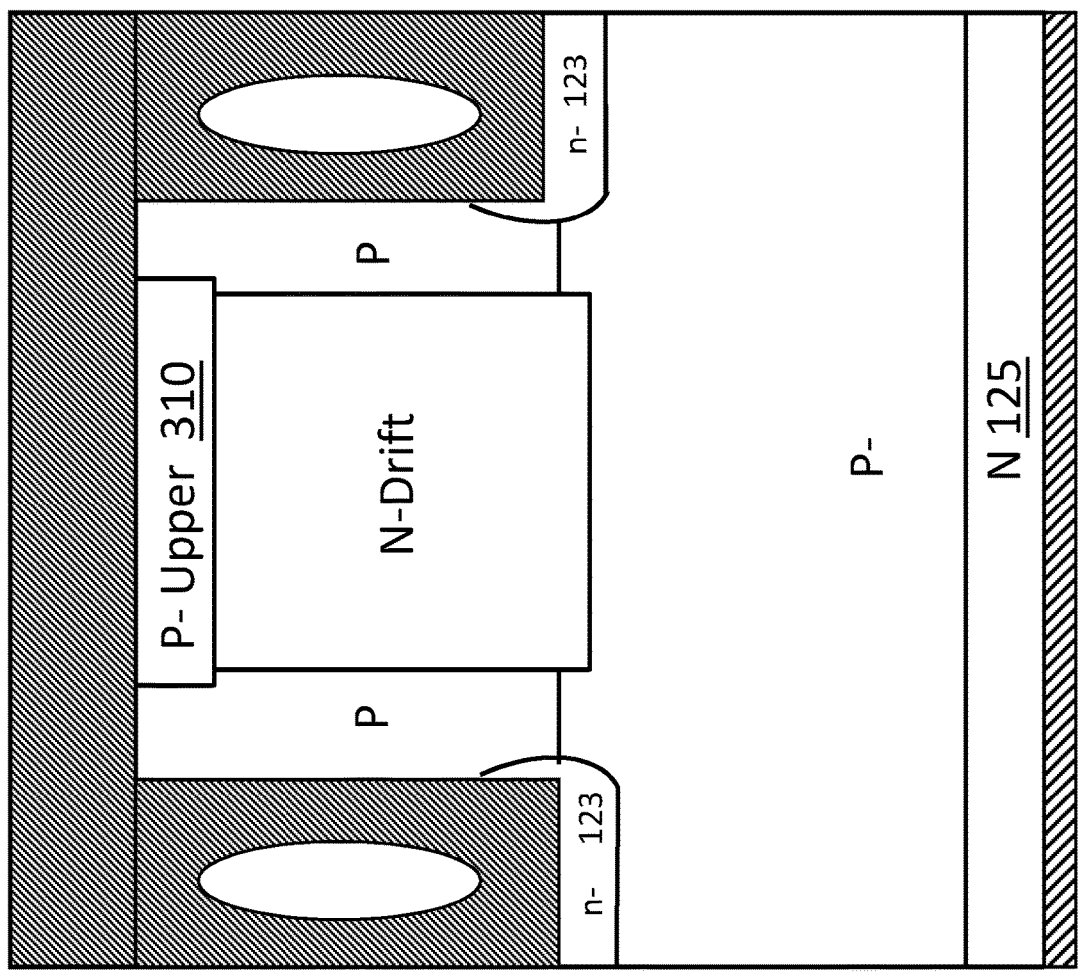

FIGS. 8A and 8B show another innovative structure, which is generally somewhat similar to that shown in FIGS. 1D and 2B, but which also includes an additional back N layer 125 below the P− layer. This structure provides isolation between the source region and the substrate. One option is to form this back N layer 125 by diffusion or implantation of the wafer back side.

The structure of FIGS. 8A-8B permits power MOSFETs to have separate respective source regions which are isolated from the bottom backside contact. This is an important advantage.

Figure 9A:
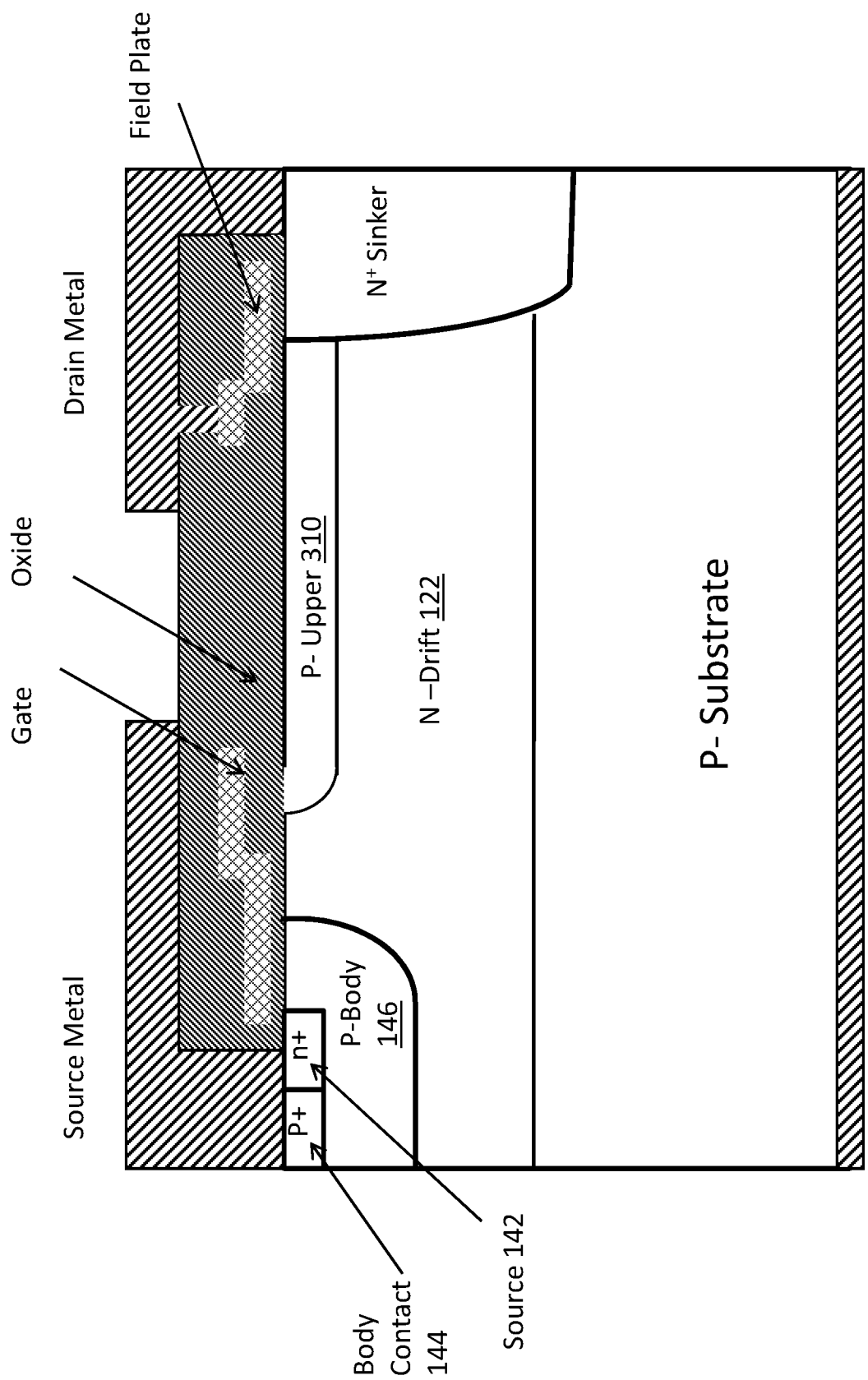
FIGS. 9A and 9B show another innovative structure, with isolated source terminals.
Figure 9B:
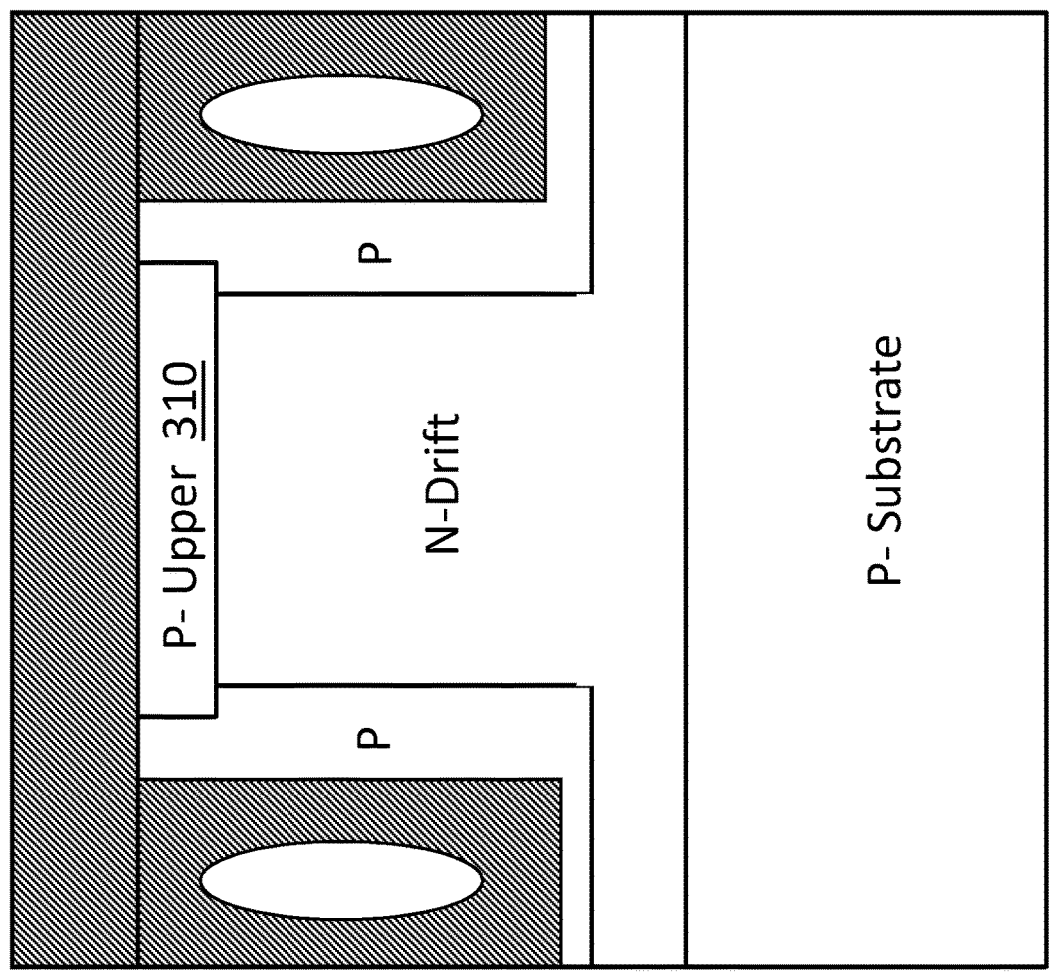

FIGS. 9A and 9B show another device structure in which the N-drift layer 122 also surrounds the p-body region 146. This structure permits power MOSFETs, with respective source regions which are isolated from each other, to be combined on a single die. This is a major advantage.

Figure 10A:
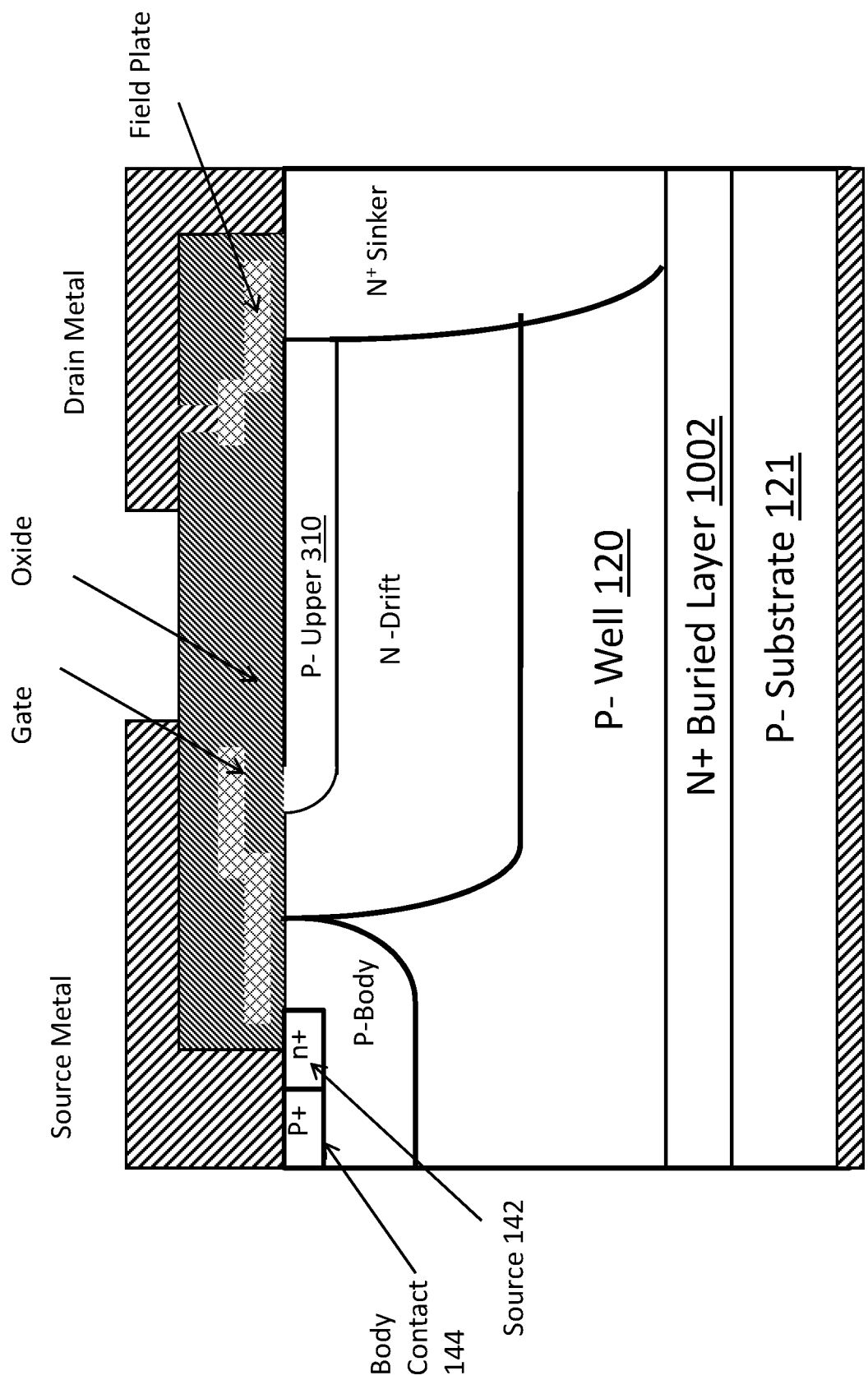
FIGS. 10A and 10B show another innovative structure, with isolated source terminals.
Figure 10B:
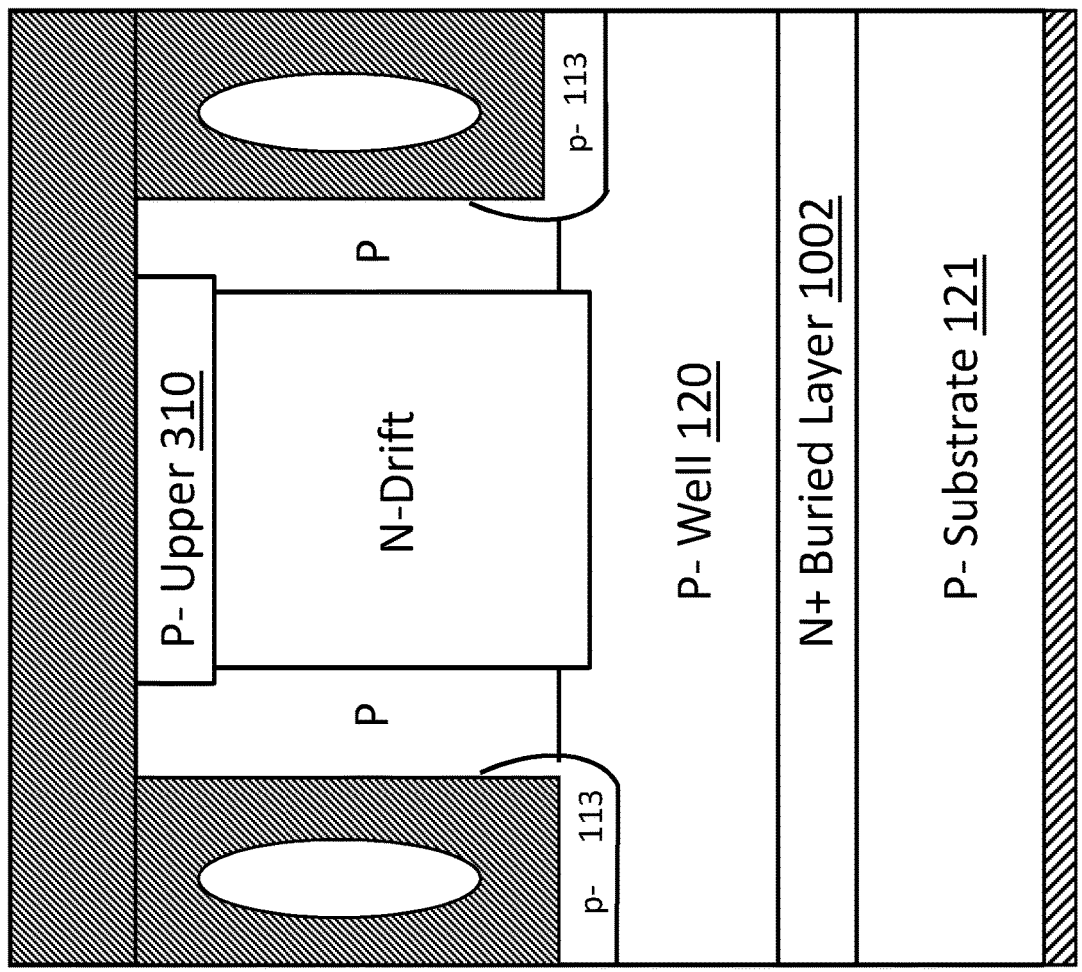

FIGS. 10A and 10B show an alternative device structure which is generally somewhat similar to that shown in FIGS. 8A and 8B, but with the addition of an N-type buried layer 1002 between the p-type substrate 121, the p-type well region 120 and p-type trench bottom layer 113 (like that of FIGS. 3A-3B). This structure advantageously provides isolated source terminals as discussed above.

Note that these isolated-source structures can (and still preferably do) incorporate the self-isolated drains of FIG. 5. This class of implementations provides further synergistic advantages: by having multiple fully isolated power channels on a single die, it is possible to integrate multiple power devices on a single die. This allows system designers to integrate more functionality into a one-chip solution.

Figure 11A:
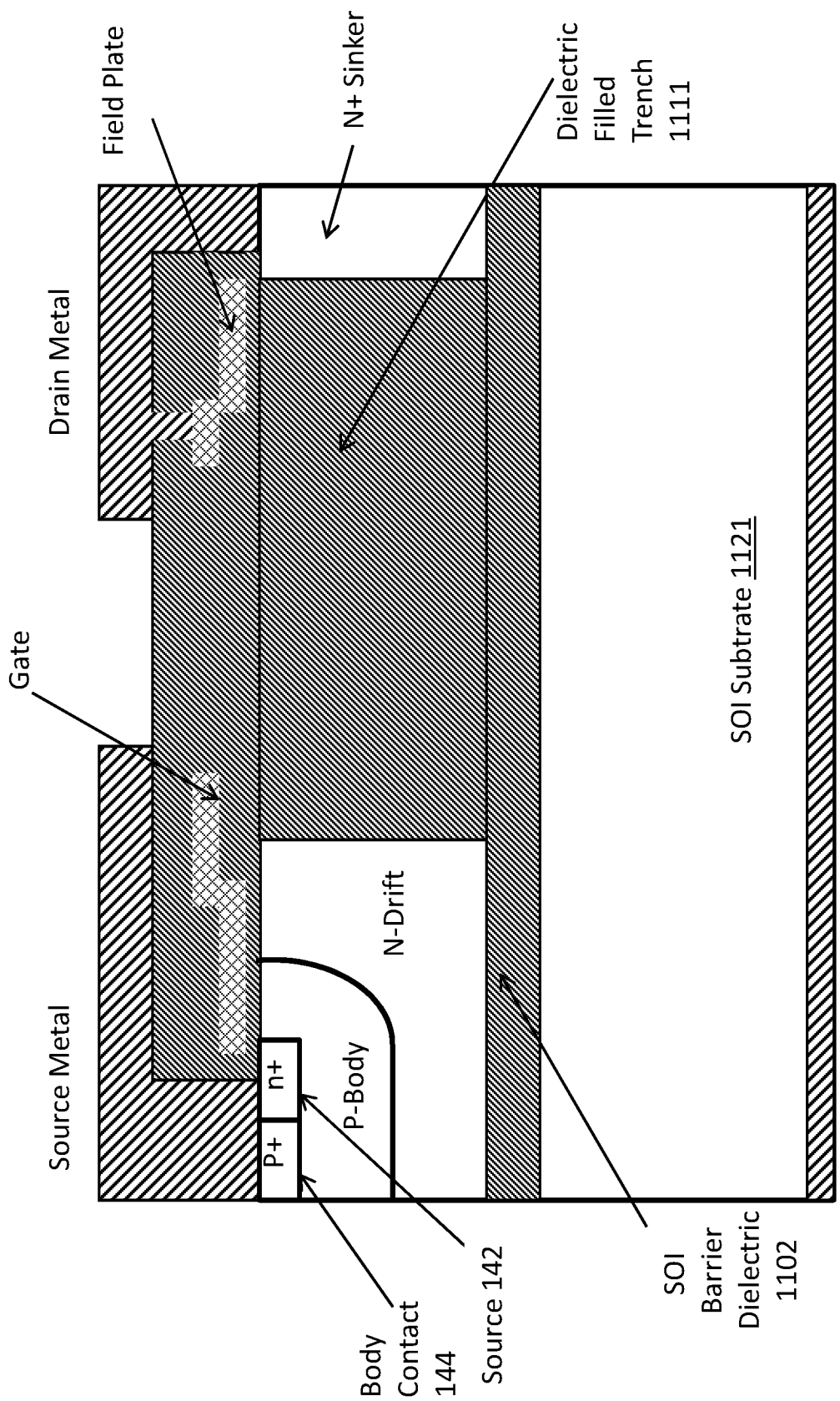
FIGS. 11A and 11B show yet another innovative structure.
Figure 11B:
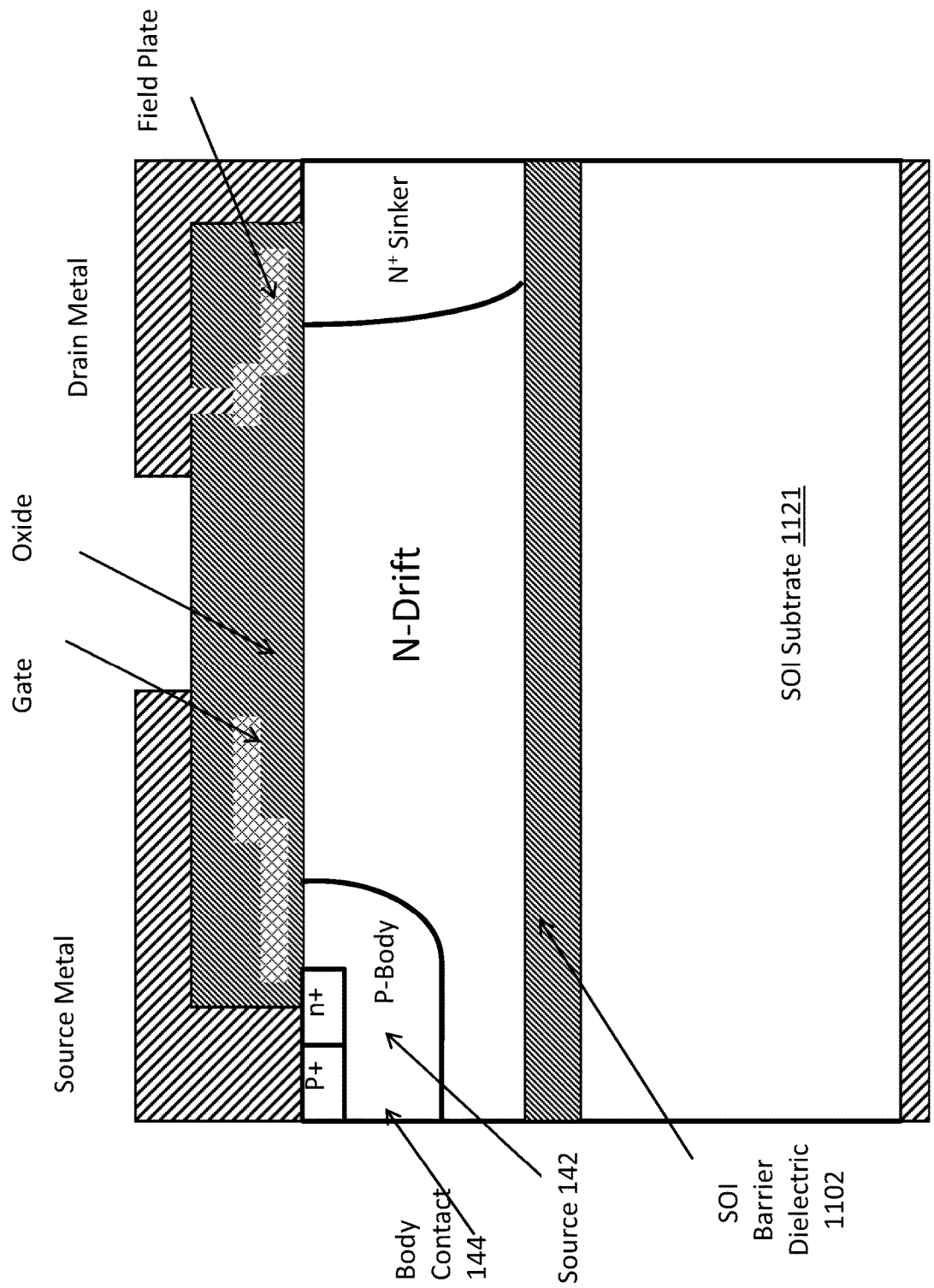
Figure 12E:
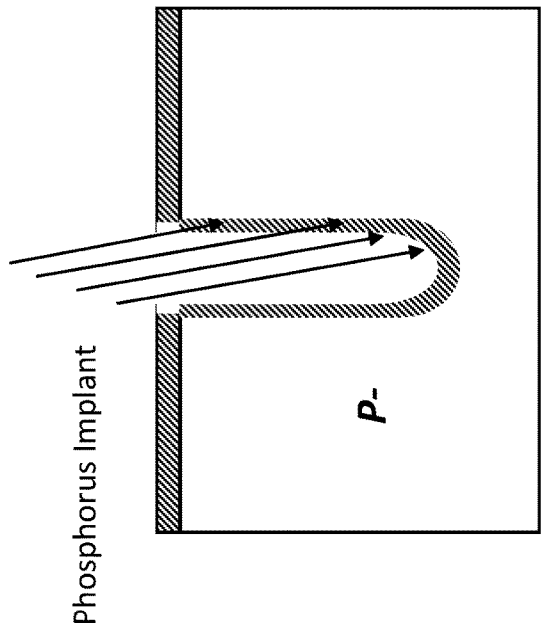
FIGS. 12E-12H show an example of process steps in another sample implementation.
Figure 12F:
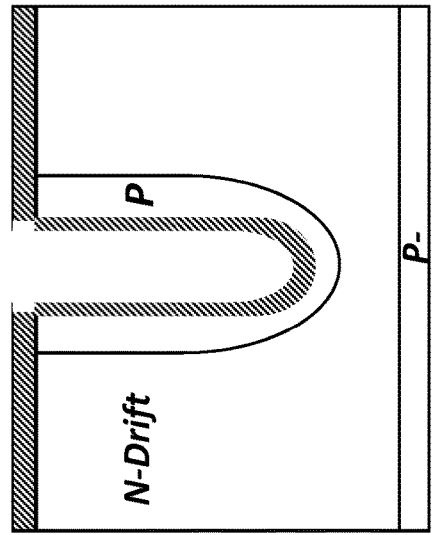
Figure 12G:
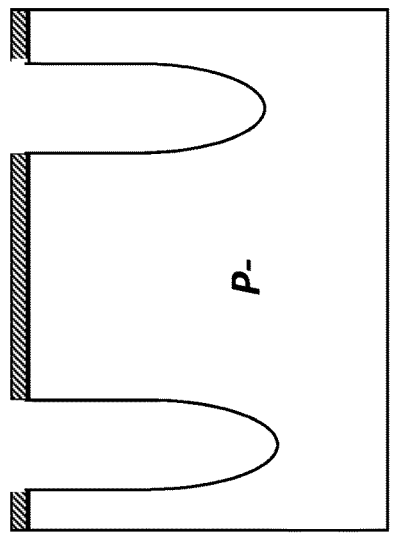
Figure 12H:
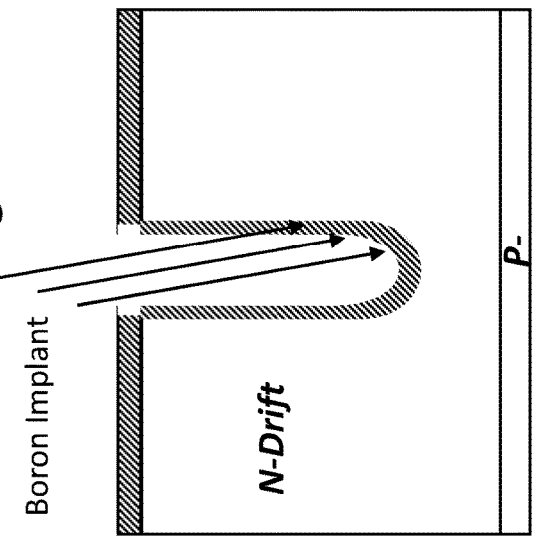

FIGS. 11A and 11B show another innovative structure, which is generally somewhat similar to that shown in FIGS. 1C and 1D, but which is implemented in Silicon-On-Insulator (SOI) material. In such structures an SOI barrier dielectric 1102 separates the active device areas from the SOI substrate 1121. In this example the substrate 1121 is p-type silicon, as in the embodiments described above, but alternatives are also possible. Dielectric-filled trenches 1111 provide full dielectric isolation if desired.

FIGS. 12A-12D show the one example implementation of the steps of forming the N-drift region (using adequate drive-in time and temperature after implantation or other dopant introduction, to achieve the desired diffusion length root-Dt), and then etching the trench, forming the P-layer, n-type trench bottom region using zero angle tilt implant and filling the trench.

FIGS. 12E-12H show an alternative method where the N-drift layer is formed by tilted angle implantation or using techniques such as plasma immersion ion implantation through the trench sidewalls (and subsequently diffused) after etching the trench. The latter method allows the use of deep trenches which results in further Rsp reduction.

Figure 13A:
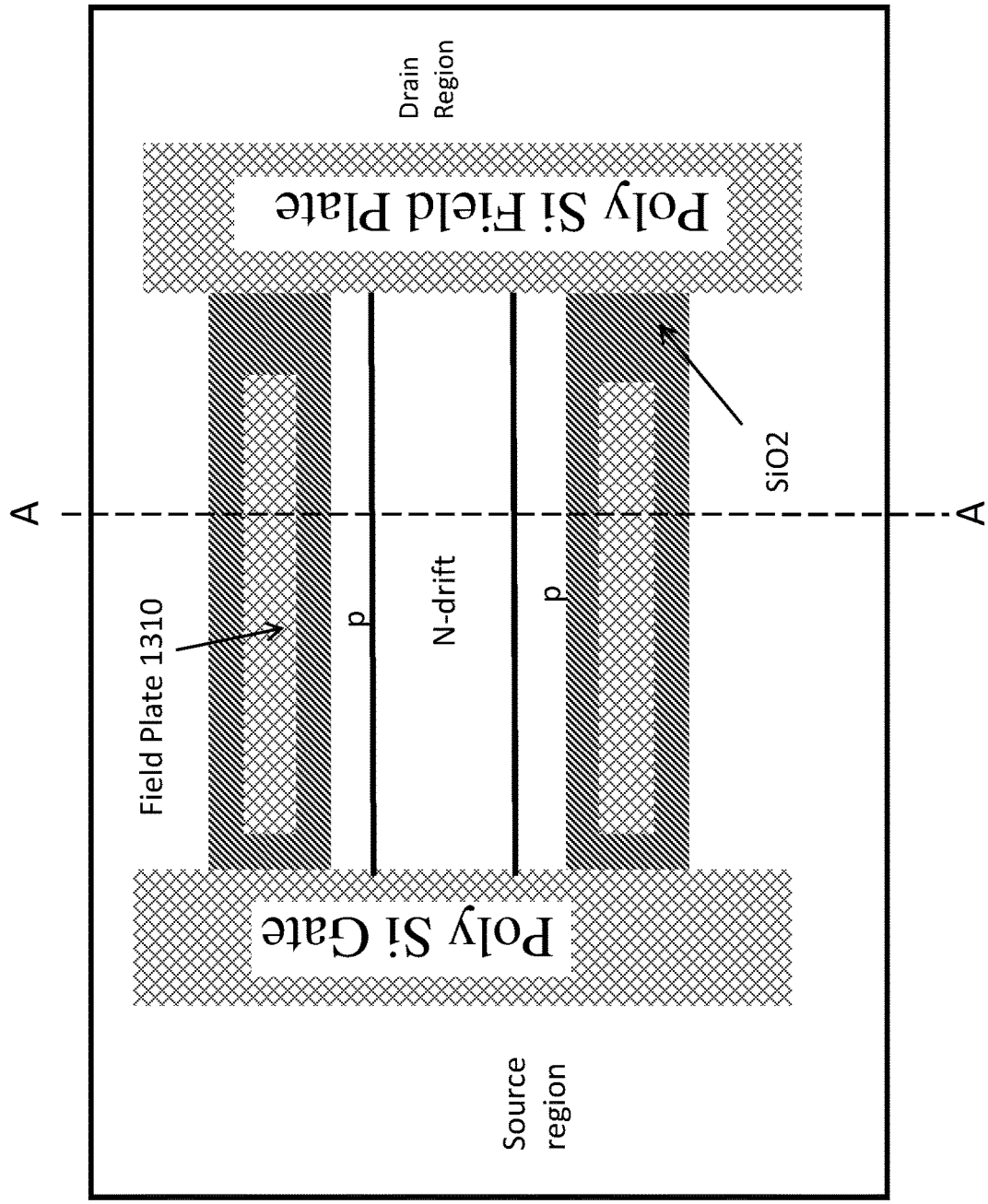
FIG. 13A shows another innovative structure.

FIG. 13A shows another embodiment which is generally somewhat similar to that shown in FIG. 1A, but with trench sidewalls lined by a dielectric material such as oxide and filled with a Field Plate 1310. The field plate, in this example, is made of polysilicon which is heavily doped with n-type doping such as phosphorus. The field plate 1310 is preferably biased to the source or gate potential, or alternatively can be floating.

The oxide layer width along the trench sidewalls can be thinner than that at the drain end of the trench. This can be achieved, for example, by filling the trench with a thick oxide layer, and then etching the oxide layer in certain regions using photoresist, followed by growing or depositing a thinner oxide layer. This step is preferably followed by polysilicon layer deposition.

Figure 13B:
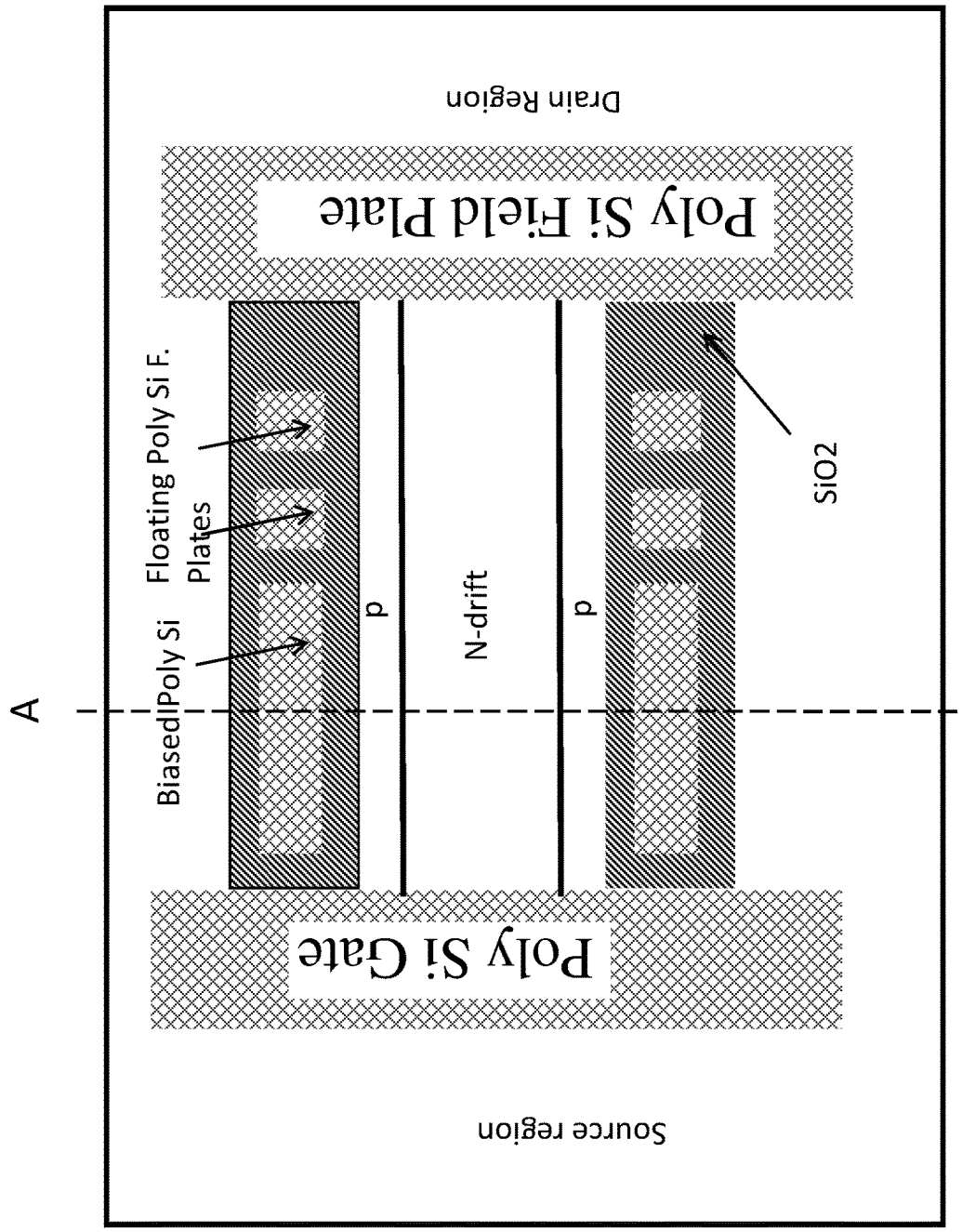
FIG. 13B shows another innovative structure.

FIG. 13B shows another innovative structure, which is generally somewhat similar to that shown in FIG. 13A, but which has multiple polysilicon regions separated by oxide layers. This provides, in effect, a segmented field plate structure. The polysilicon regions can be biased or floating.

Figure 13C:
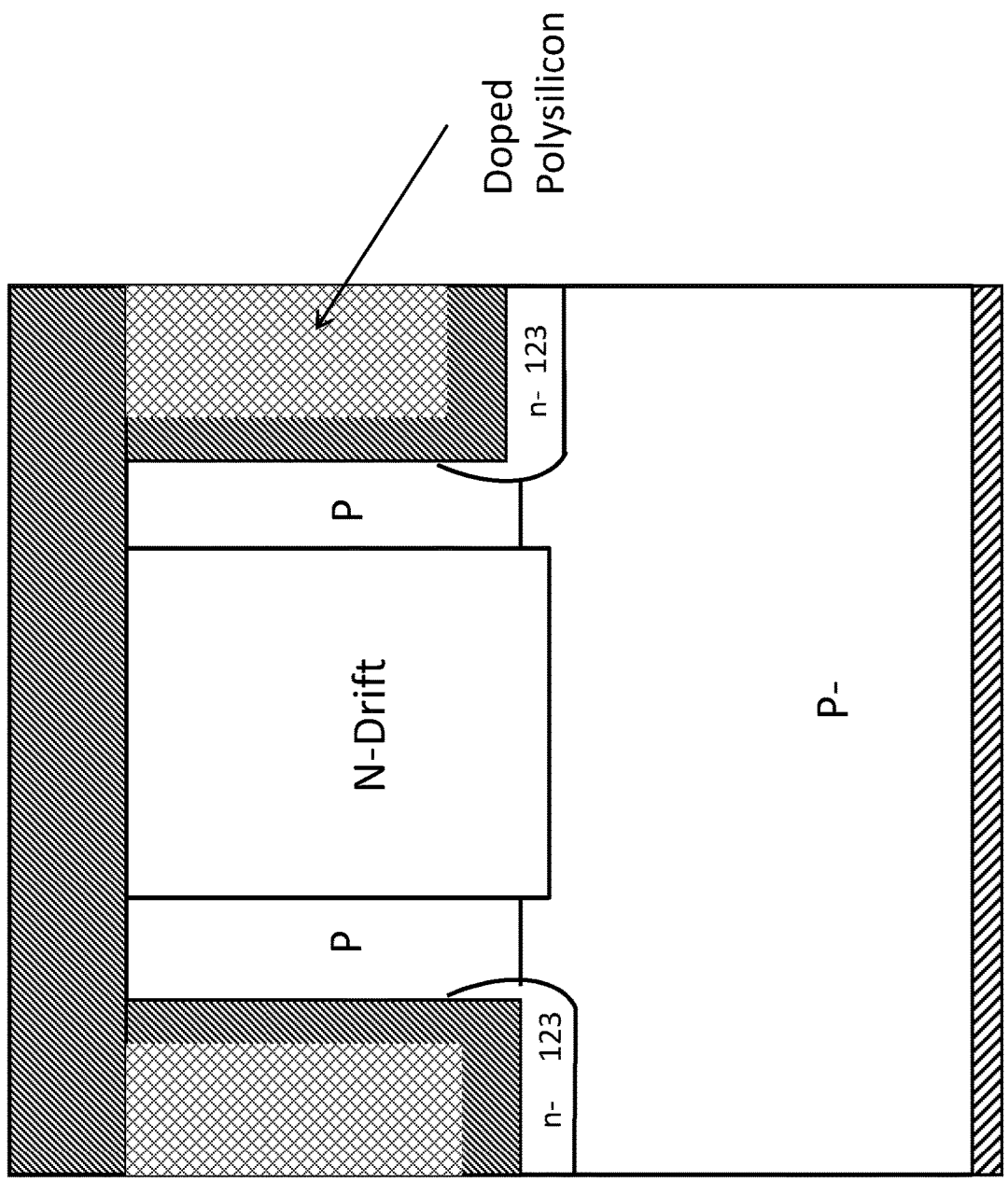
FIG. 13C shows a cross section of FIGS. 13A and 13B.

FIG. 13C shows a cross section along line A-A of both FIGS. 13A and 13B.

Figure 14A:
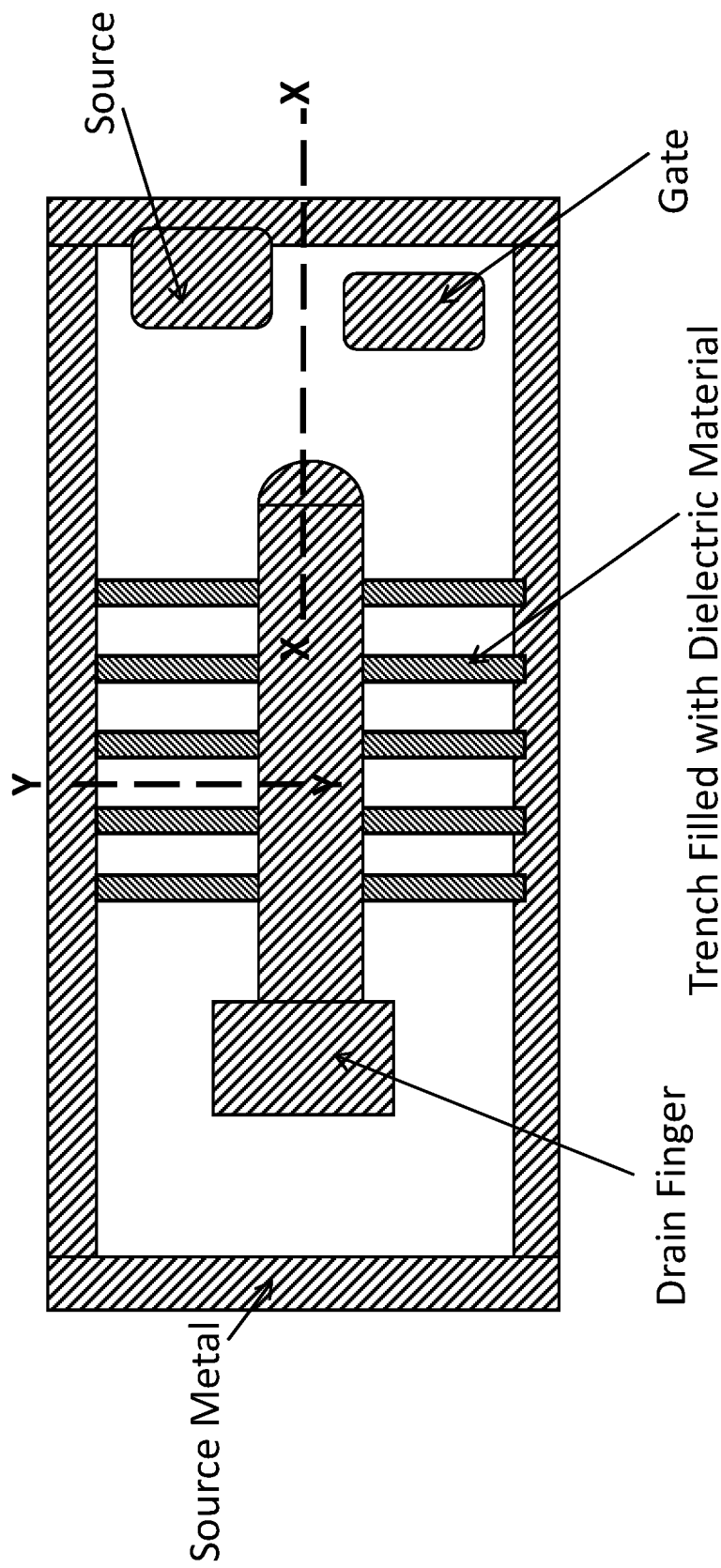
FIG. 14A shows another innovative structure.

FIG. 14A shows an example of implementation of metallization. This is a top view of a lateral n-channel transistor with the drain fingertip, source, gate and drain terminals. The cross section along the line Y-Y can be for example that shown in any of the FIGS. 1D, 6, 7A, 8A and 11B.

Figure 14B:
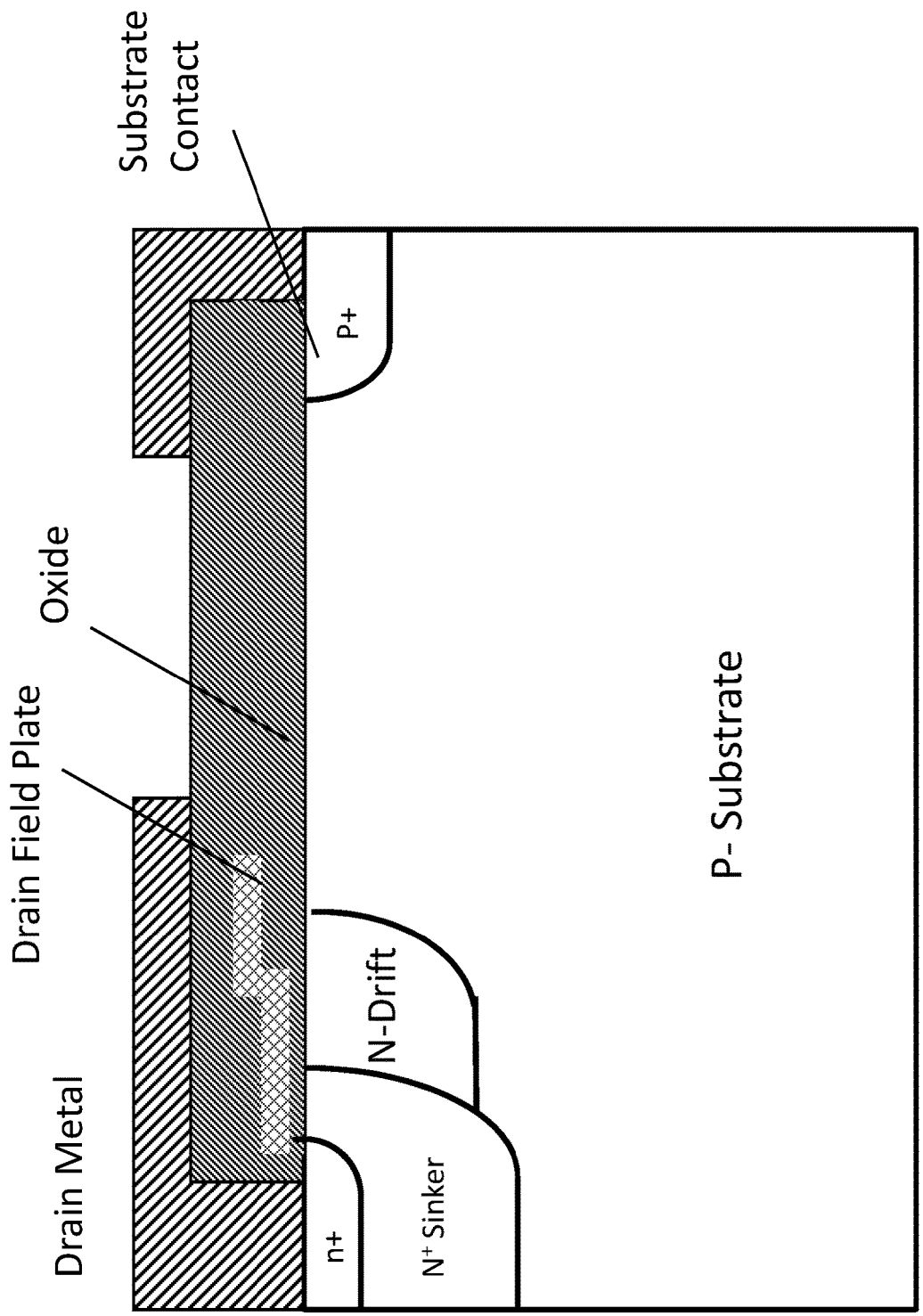
FIG. 14B shows a cross section of it.

FIG. 14B is a cross section along the line X-X of the device shown in FIG. 14A showing one implementation using a field plate 1402 extending toward the edge over increasing dielectric thickness in a stair step fashion; this permits the field plate to smooth the potential gradients in the semiconductor material nearest the junction, while avoiding any sharp change in potential at the outer edge of the field plate.

It should be noted that the surface of the device can be covered by an additional suitable dielectric material such as silicon nitride or similar passivation layers. Such passivation layer(s) were not shown in the previous figures, for simplicity.

Figure 14C:
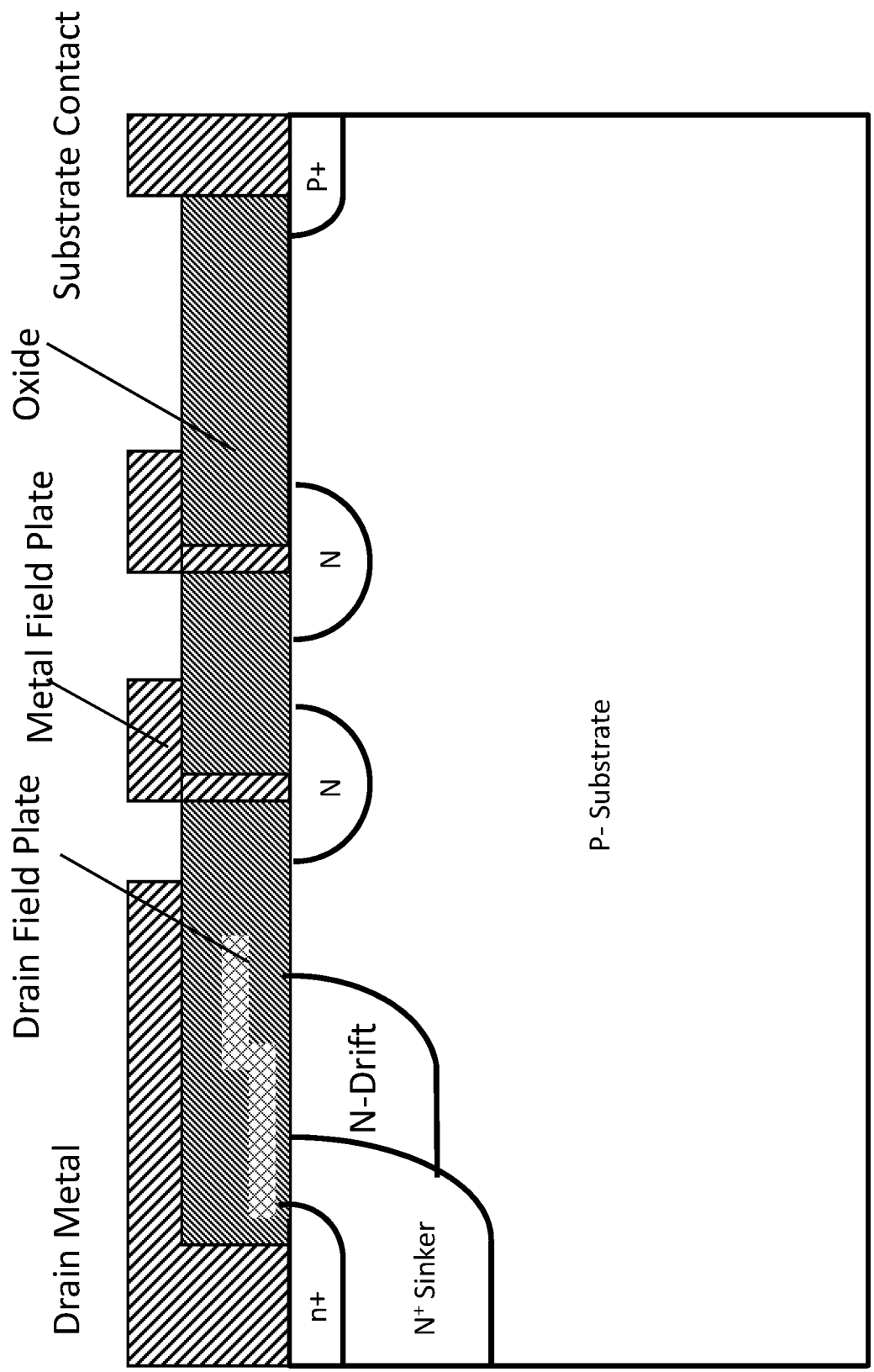
FIG. 14C shows another innovative structure.

FIG. 14C shows another innovative structure, in which floating N-type guard rings 1412 are used in the termination. It should be noted that the surface of the device can be covered by an additional suitable dielectric material such as silicon nitride or similar passivation layers. Such passivation layer was not shown in the previous figures for simplicity, but would commonly be included.

Figure 15A:
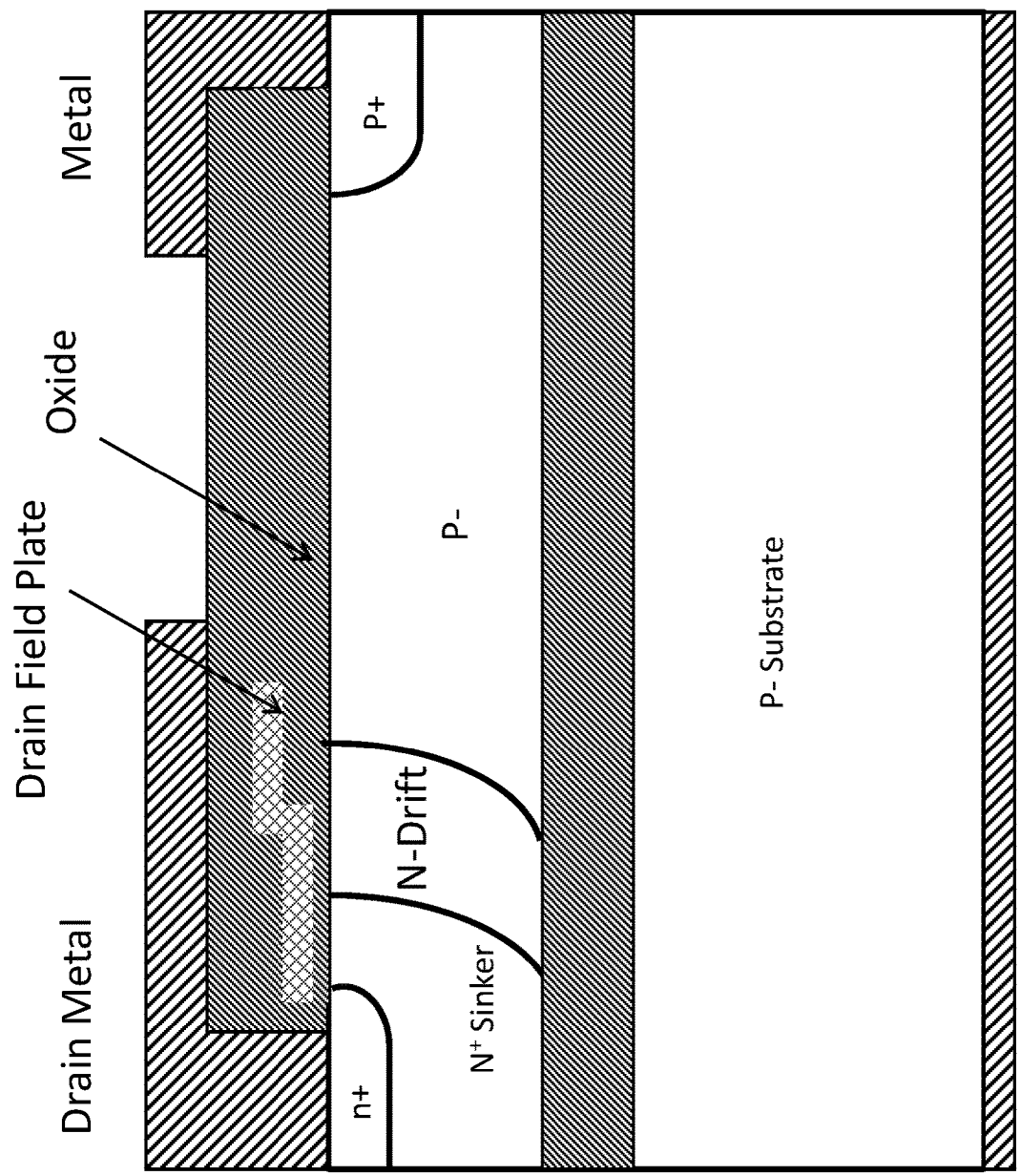
FIG. 15A shows another innovative structure using SOI.

FIG. 15A shows another example, where the device termination uses an SOI structure.

Figure 15B:
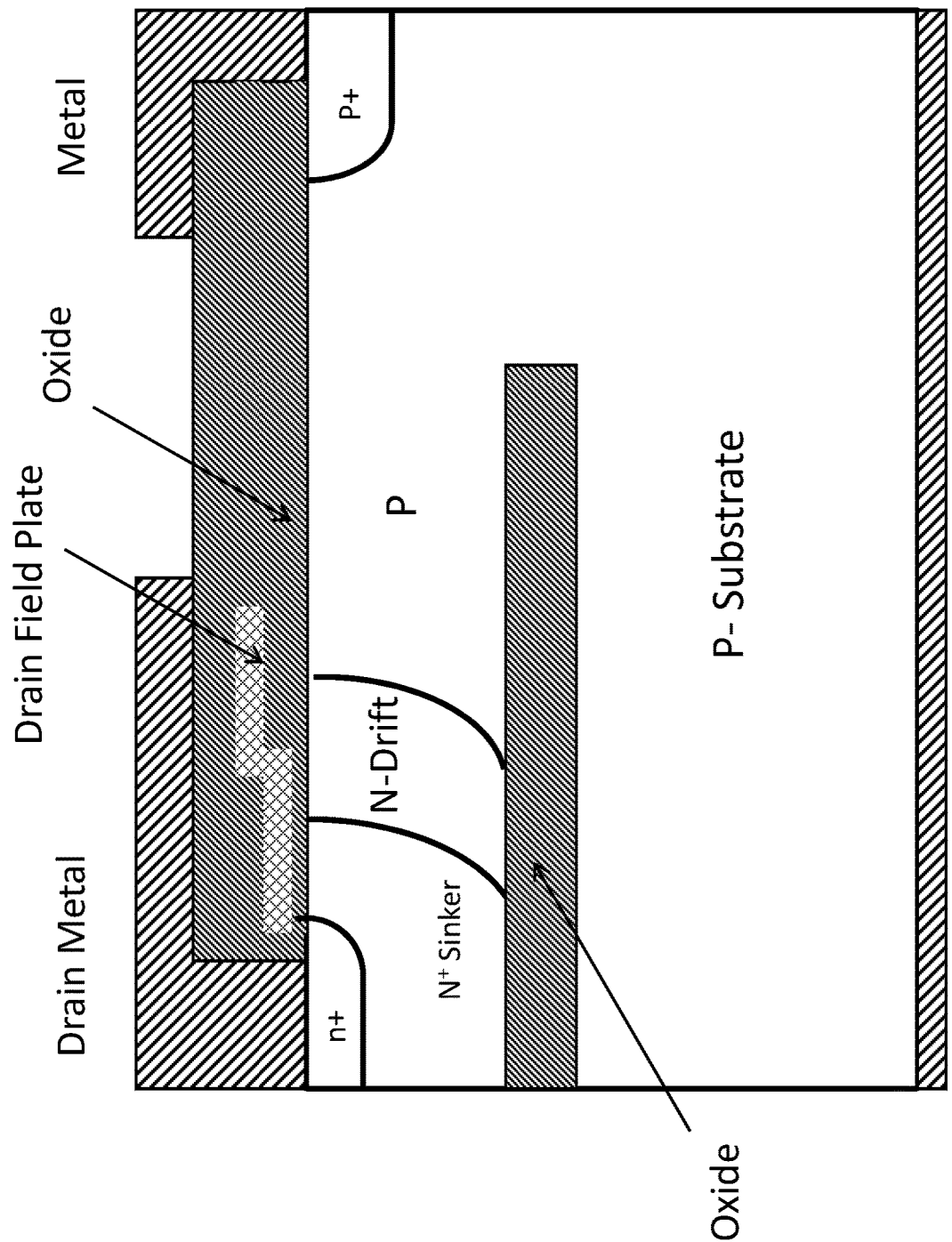
FIG. 15B shows another innovative structure using a partial SOI structure.

FIG. 15B shows another embodiment of a device termination using a partial SOI structure for improved thermal dissipation.

Figure 16A:
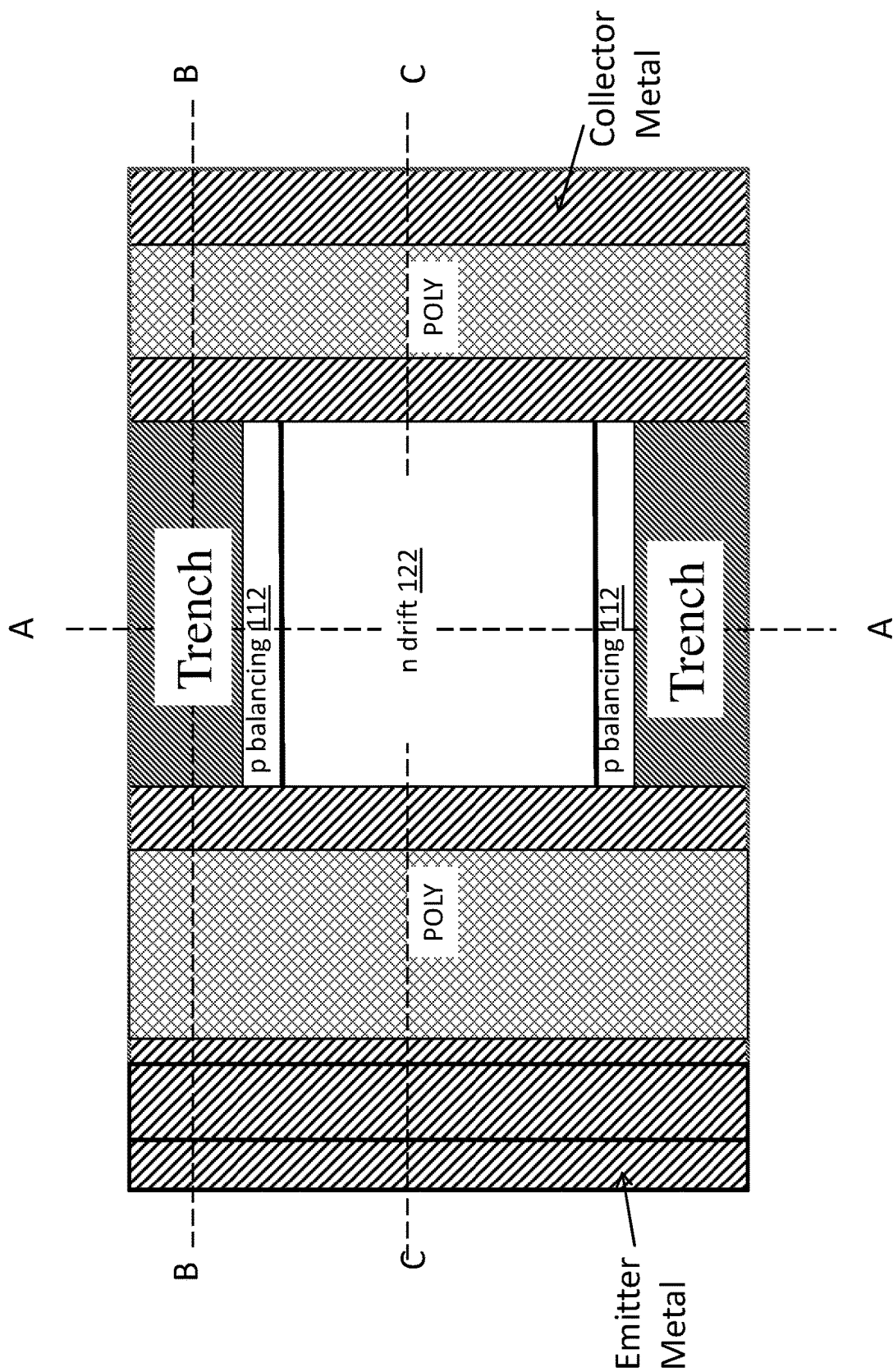
FIG. 16A shows another innovative structure.

FIG. 16A shows another innovative structure. This Figure shows a top view of a lateral IGBT, in which the emitter, gate and collector terminals (1602, 1604, and 1606 respectively) are all accessible at the device surface.

Figure 16B:
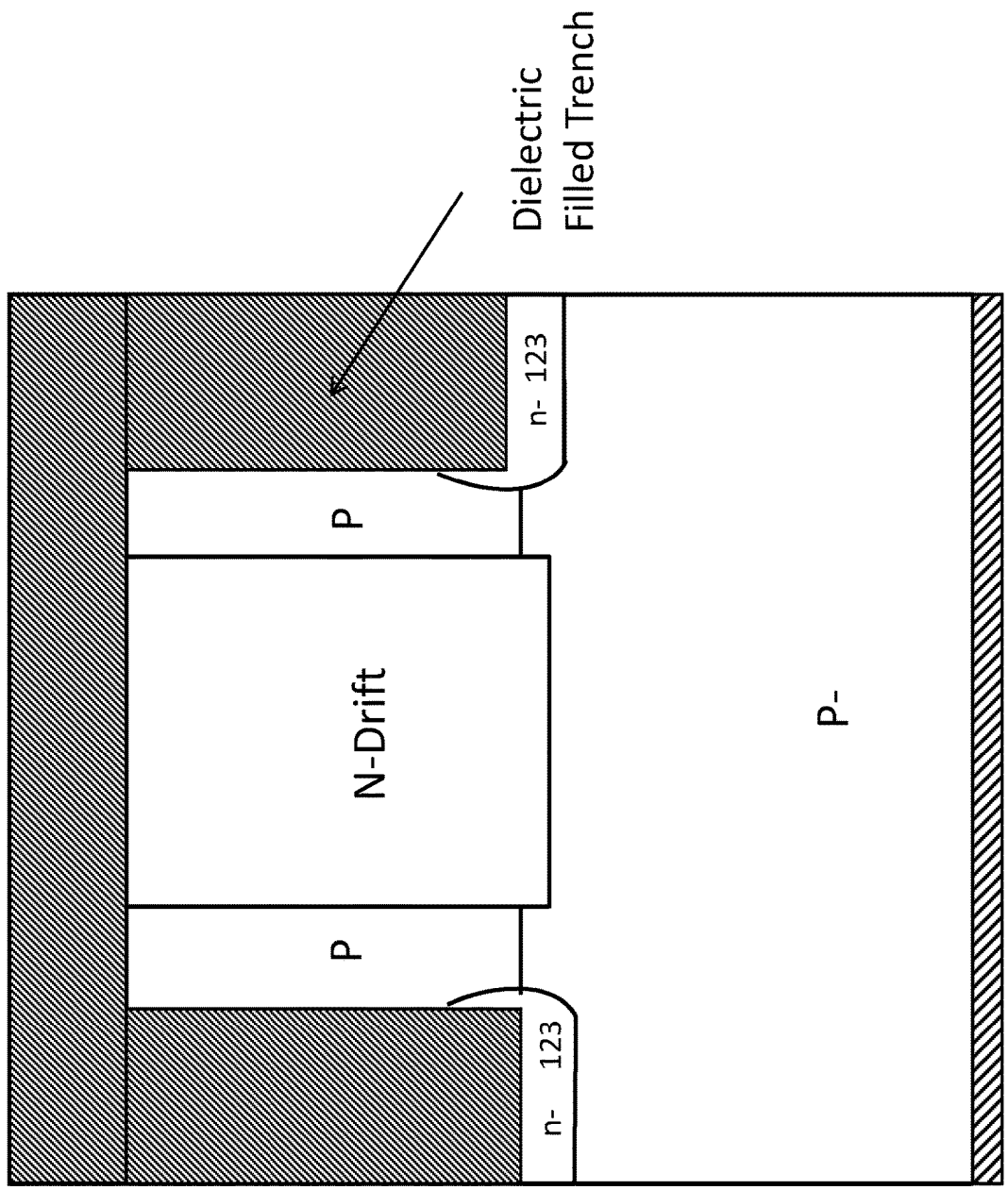
FIGS. 16B, 16C, and 16D show cross sections of it.

FIG. 16B shows a cross section along the line A-A of the device shown in FIG. 16A.

Figure 16C:
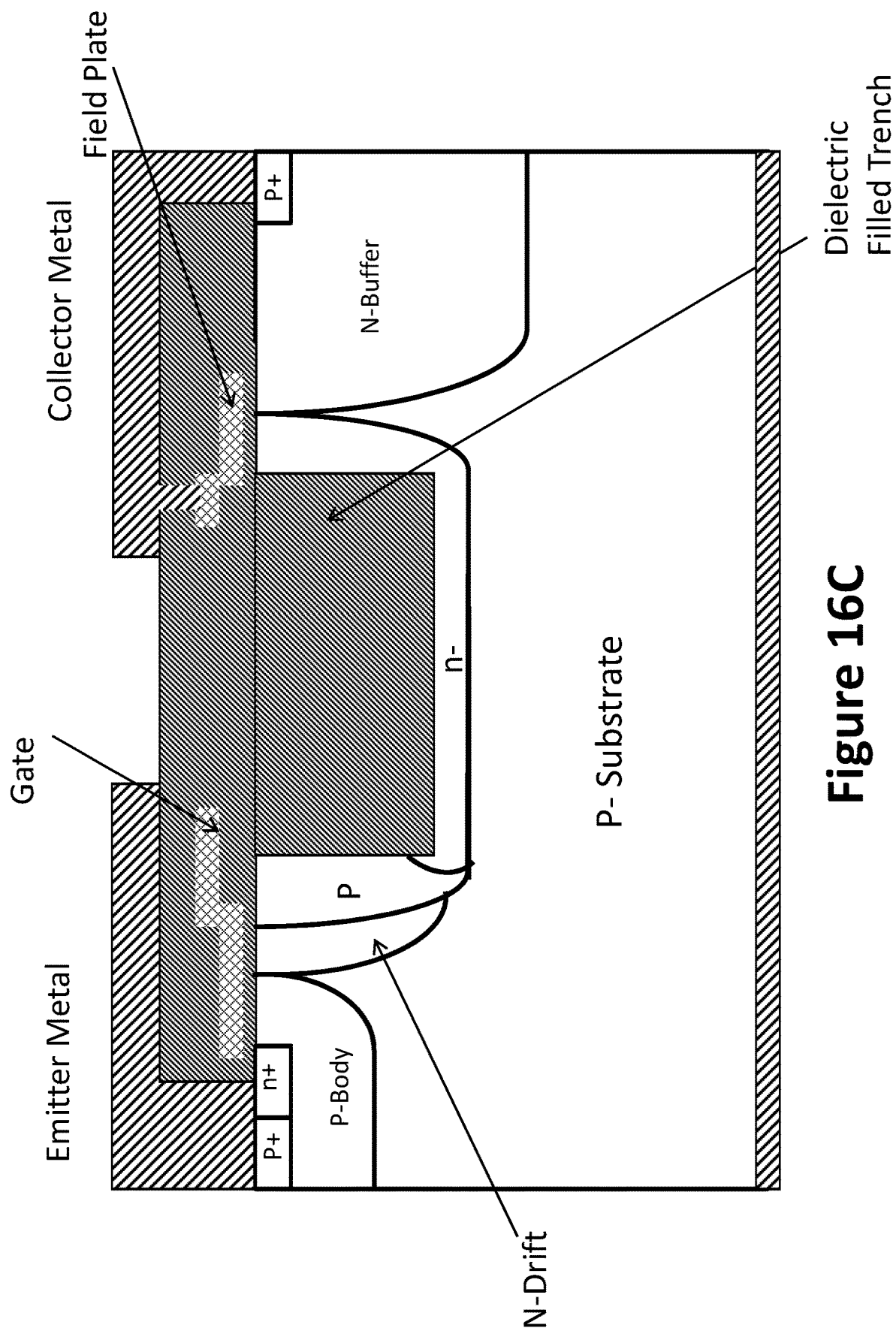

FIG. 16C shows a cross section along the line B-B of the device shown in FIG. 16A. The structure of FIG. 16C is generally somewhat similar to that shown in FIG. 1C, except that the deep N+ sinker at the drain is replaced by an N-buffer layer and a P+ layer at the collector contact.

Figure 16D:
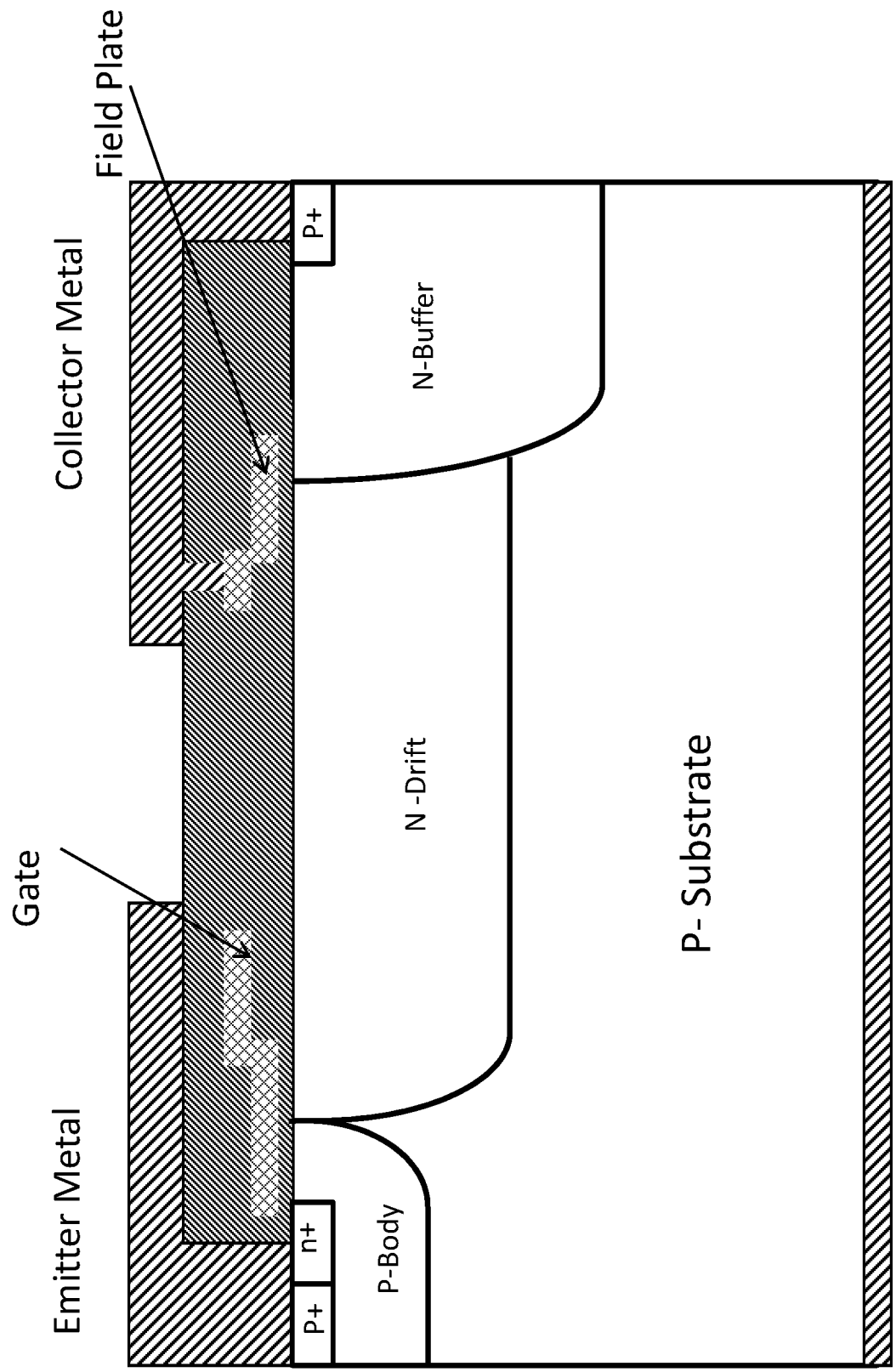

FIG. 16D shows a cross section along the line C-C of the device shown in FIG. 10A. The structure in this Figure is generally somewhat similar to that shown in FIG. 1D, except that the deep N+ sinker at the drain is replaced by an N-buffer layer 1632 and a P+ layer 1634 at the collector contact.

Figure 17A:
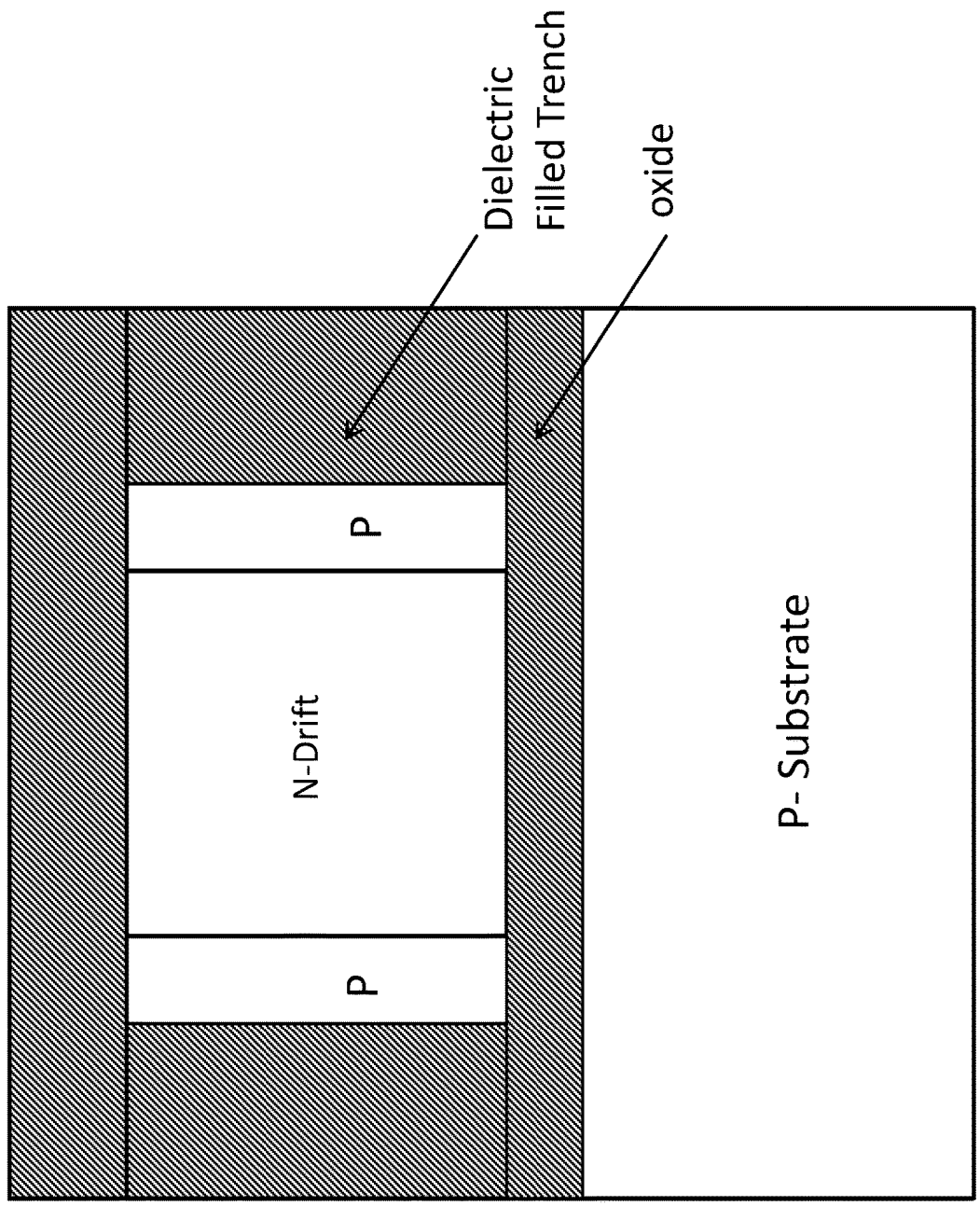
FIGS. 17A-17D show another innovative structure.
Figure 17B:
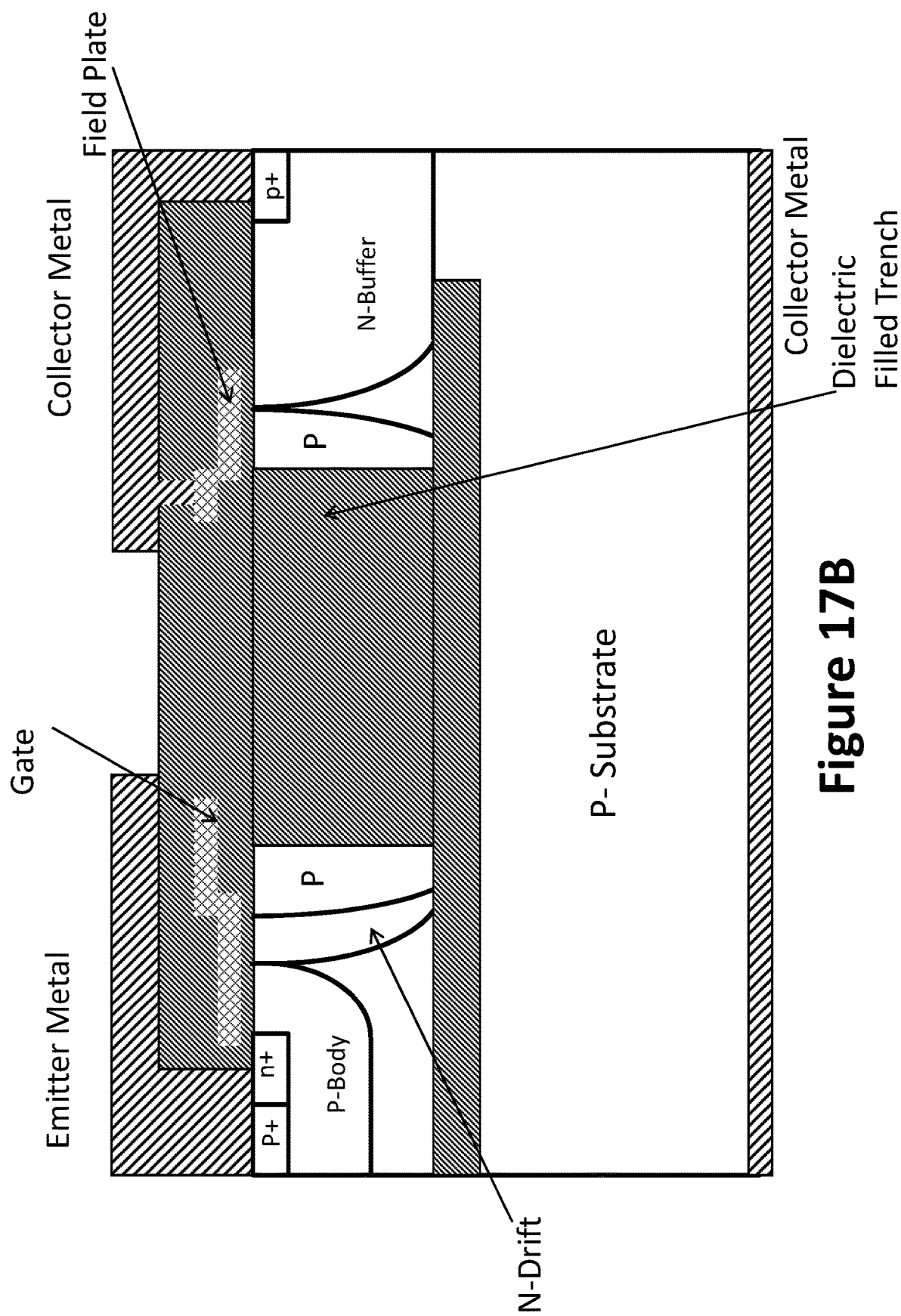

FIGS. 17A-D show another embodiment of a lateral IGBT, which is generally somewhat similar to that shown in FIGS. 16A-D, except for the use of partial SOI. FIG. 17A shows a cross section along line A-A of the top view shown in FIG. 16A, and FIG. 17B shows a cross section along line B-B.

Figure 17C:
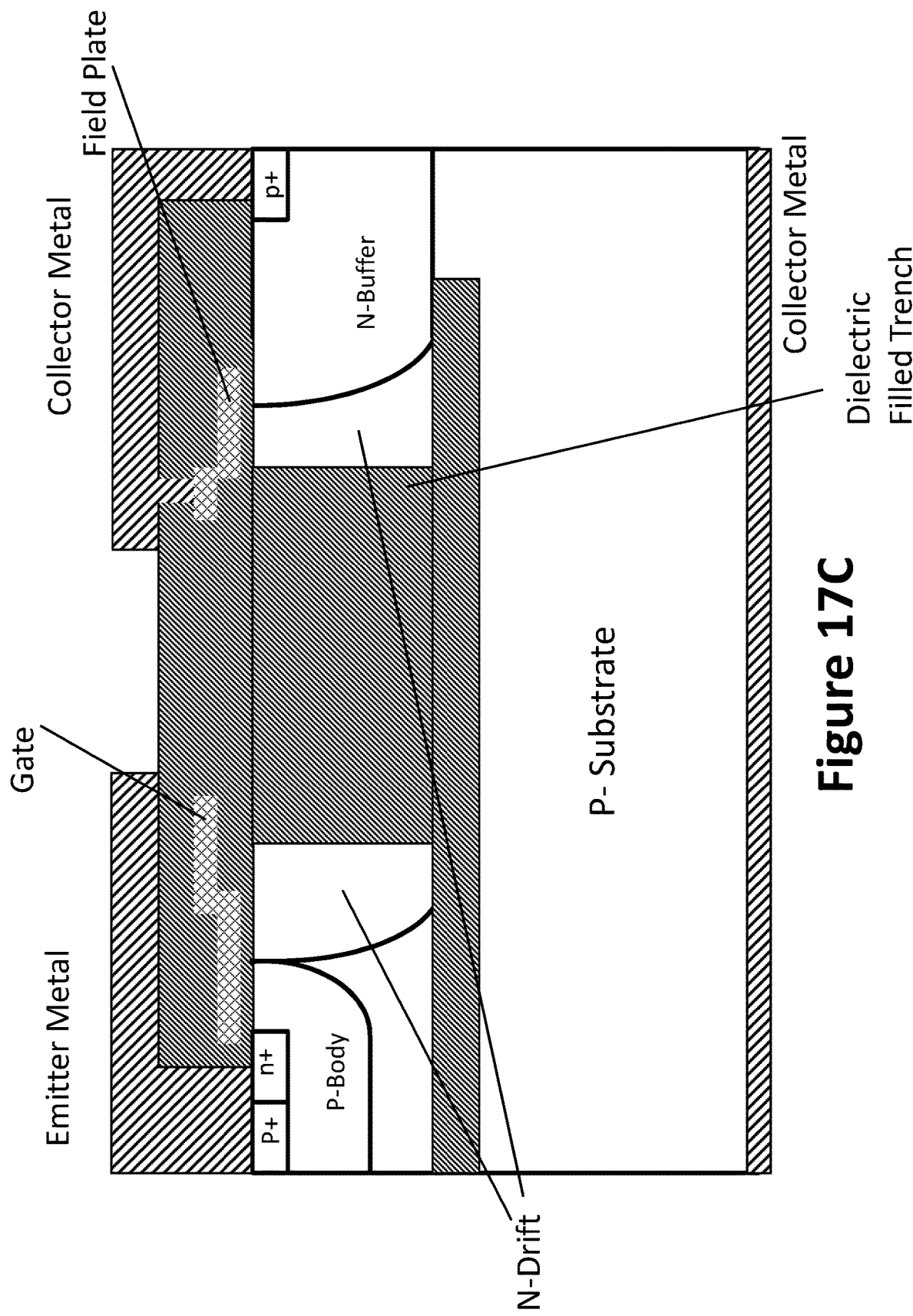

FIG. 17C shows a cross section of an alternative embodiment along the line B-B.

Figure 17D:
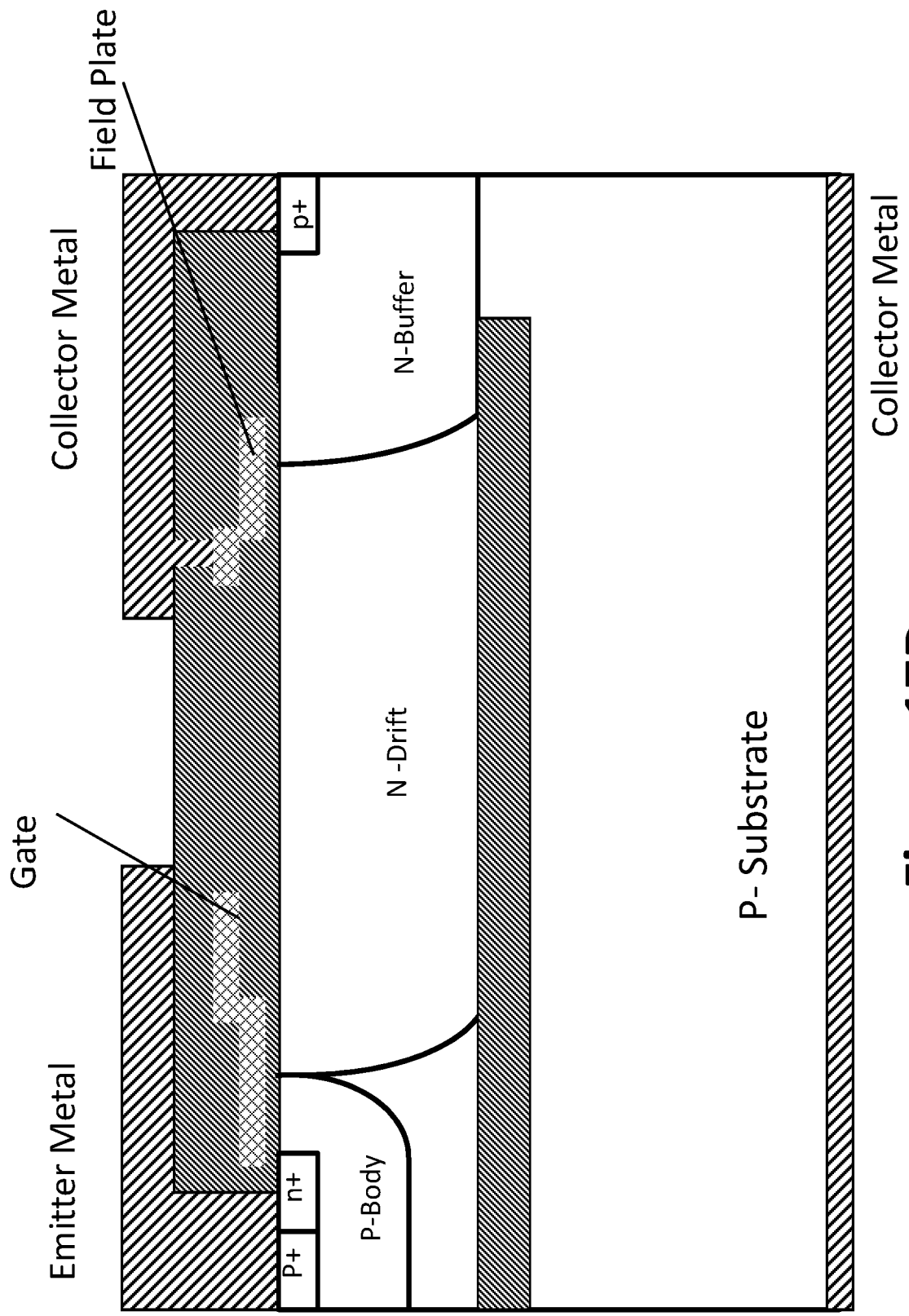

FIG. 17D shows a cross section along line C-C of the top view shown in FIG. 16A.

Advantages

The disclosed innovations, in various embodiments, provide one or more of at least the following advantages. However, not all of these advantages result from every one of the innovations disclosed, and this list of advantages does not limit the various claimed inventions.

Power semiconductor devices with lower on-resistance:
Power semiconductor devices with lower cost;
Power semiconductor devices which do not require epitaxial material;
Power superjunction semiconductor devices with better charge balance control.
Integrable power semiconductor devices;
Power semiconductor devices with more ruggedness;
Power semiconductor devices with higher breakdown voltage;
Dice with multiple independent power drivers; and
Dice with multiple independent power drivers, plus small-signal circuits, all integrated together.

According to some but not necessarily all embodiments, there is provided: A lateral power semiconductor device, comprising: a first-conductivity-type source region; a second-conductivity-type body region, and a gate electrode which is capacitively coupled to a portion of the body region which is laterally adjacent to the source region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, through the drift region, to the drain region; wherein the source, body, drift, and drain regions are all located near a single surface of a second-conductivity-type semiconductor substrate, to permit predominantly lateral flow of carriers when a channel is present; and second-conductivity-type charge balancing regions which laterally confine a portion of the drift region and which are laterally flanked by insulating trenches; wherein, when the gate is not inverting the body, and reverse bias is present between the source and drain regions, the drift region, and the charge balancing regions adjacent to the drift region, will be substantially depleted before breakdown occurs.

According to some but not necessarily all embodiments, there is provided: A lateral power semiconductor device, comprising: a first-conductivity-type source region; a second-conductivity-type body region, and a gate electrode which is capacitively coupled to a portion of the body region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, through the drift region, to the drain region; wherein the source, body, drift, and drain regions are all located within a mass of second-conductivity-type semiconductor material; second-conductivity-type charge balancing regions which laterally flank the drift region, and which are laterally flanked by insulating trenches; and first-conductivity-type bottom regions below the trenches; wherein, when reverse bias is present between the source and drain regions, the space charge of depleted portions of the second-conductivity-type charge balancing regions will at least partially balance the space charge of depleted portions of the drift region, and the space charge of depleted portions of the first-conductivity-type bottom regions will at least partially balance the space charge of depleted portions of the second-conductivity-type semiconductor mass.

According to some but not necessarily all embodiments, there is provided: A lateral power semiconductor device, comprising: a first-conductivity-type source region; a second-conductivity-type body region, and a gate electrode which is capacitively coupled to a portion of the body region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, laterally through the drift region, to the drain region; wherein the source, body, drift, and drain regions are all located within a mass of second-conductivity-type semiconductor material; second-conductivity-type charge balancing regions which laterally flank the drift region, and which are laterally flanked by insulating trenches; and a second-conductivity-type upper region which overlies the drift region; wherein, when reverse bias is present between the source and drain regions, the space charge of depleted portions of the second-conductivity-type charge balancing regions and of the upper region will at least partially balance the space charge of depleted portions of the drift region.

According to some but not necessarily all embodiments, there is provided: A lateral power semiconductor device, comprising: an n-type source region; a p-type body region, and a gate electrode which is capacitively coupled to a portion of the body region; an n-type drain region; an n-type drift region, which is laterally interposed between the drain region and the body region in an electrical relation such that, when the gate electrode has a positive voltage which inverts part of the body region to form a channel therein, electrons can flow from the source region, through the channel, laterally through the drift region, and to the drain region; wherein the source, body, drift, and drain regions are all located within a mass of p-type semiconductor material; and p-type charge balancing regions which laterally flank the drift region, and which are laterally flanked by insulating trenches which include immobile positive electrostatic charge; and wherein, when reverse bias is present between the source and drain regions, the negative space charge of depleted portions of the p-type charge balancing regions, will at least partially balance the positive space charge of depleted portions of the drift region in combination with the fixed charge in the trenches According to some but not necessarily all embodiments, there is provided: A power semiconductor device, comprising, on a single die, multiple lateral power transistors which each include: a first-conductivity-type source region; a second-conductivity-type body region, and a gate electrode which is capacitively coupled to a portion of the body region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, laterally through the drift region, to the drain region; wherein the source, body, drift, and drain regions are all located within a mass of second-conductivity-type semiconductor material; and second-conductivity-type charge balancing regions which laterally flank the drift region, and which are laterally flanked by insulating trenches; wherein, when reverse bias is present between the source and drain regions, the space charge of depleted portions of the second-conductivity-type charge balancing regions and of the upper region will at least partially balance the space charge of depleted portions of the drift region; and wherein the respective drain regions of the multiple transistors are isolated from each other by intervening portions of the second-conductivity-type mass of semiconductor material.

According to some but not necessarily all embodiments, there is provided: A lateral power semiconductor device, comprising: a first-conductivity-type source region; a second-conductivity-type body region, and a gate electrode which is capacitively coupled to a portion of the body region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, through the drift region, to the drain region; wherein the source, body, drift, and drain regions are all located within a second-conductivity type well, which overlies a first-conductivity-type buried layer, which in turn overlies a mass of second-conductivity-type semiconductor material; second-conductivity-type charge balancing regions which laterally flank the drift region, and which are laterally flanked by insulating trenches; and wherein, when reverse bias is present between the source and drain regions, the space charge of depleted portions of the second-conductivity-type charge balancing regions will at least partially balance the space charge of depleted portions of the drift region.

According to some but not necessarily all embodiments, there is provided: A lateral power semiconductor device with bipolar conduction, comprising: a first-conductivity-type emitter region; a second-conductivity-type body region, and a gate electrode which is capacitively coupled to a portion of the body region; a second-conductivity-type collector region; a first-conductivity-type drift region, which is laterally interposed between the collector region and the body region in an electrical relation such that, when the gate electrode has a voltage which inverts part of the body region to form a channel therein, majority carriers can flow from the emitter region, through the channel, through the drift region, to the collector region; and minority carriers are injected from the collector region through the drift region to the emitter region; and second-conductivity-type charge balancing regions which laterally flank the drift region, and which are laterally flanked by insulating trenches; wherein, when reverse bias is present between the emitter and collector regions, the space charge of depleted portions of the second-conductivity-type charge balancing regions will at least partially balance the space charge of depleted portions of the drift region.

According to some but not necessarily all embodiments, there is provided: A method for switching electrical power, comprising: driving the gate of a lateral power semiconductor device, comprising: a first-conductivity-type source region; a second-conductivity-type body region, and a gate electrode which is capacitively coupled to a portion of the body region which is laterally adjacent to the source region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, through the drift region, to the drain region; wherein the source, body, drift, and drain regions are all located near a single surface of a second-conductivity-type semiconductor substrate, to permit predominantly lateral flow of carriers when a channel is present; and second-conductivity-type charge balancing regions which laterally confine a portion of the drift region; wherein, when the gate is not inverting the body, and reverse bias is present between the source and drain regions, the drift region, and the charge balancing regions adjacent to the drift region, will be substantially depleted before breakdown occurs.

According to some but not necessarily all embodiments, there is provided a method for switching electrical power by driving the gate of a lateral power semiconductor device which comprises: a first-conductivity-type source region; a second-conductivity-type body region, and a gate electrode which is capacitively coupled to a portion of the body region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, through the drift region, to the drain region; wherein the source, body, drift, and drain regions are all located within a mass of second-conductivity-type semiconductor material; second-conductivity-type charge balancing regions which laterally flank the drift region, and which are laterally flanked by insulating trenches; and first-conductivity-type bottom regions below the trenches; wherein, when reverse bias is present between the source and drain regions, the space charge of depleted portions of the second-conductivity-type charge balancing regions will at least partially balance the space charge of depleted portions of the drift region, and the space charge of depleted portions of the first-conductivity-type bottom regions will at least partially balance the space charge of depleted portions of the second-conductivity-type semiconductor mass.

According to some but not necessarily all embodiments, there is provided a method for switching electrical power by driving the gate of a lateral power semiconductor device which comprises: a first-conductivity-type source region; a second-conductivity-type body region, and a gate electrode which is capacitively coupled to a portion of the body region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, laterally through the drift region, to the drain region; wherein the source, body, drift, and drain regions are all located within a mass of second-conductivity-type semiconductor material; second-conductivity-type charge balancing regions which laterally flank the drift region, and which are laterally flanked by insulating trenches; and a second-conductivity-type upper region which overlies the drift region; wherein, when reverse bias is present between the source and drain regions, the space charge of depleted portions of the second-conductivity-type charge balancing regions and of the upper region will at least partially balance the space charge of depleted portions of the drift region.

According to some but not necessarily all embodiments, there is provided a method for switching electrical power by driving the gate of a lateral power semiconductor device which comprises: an n-type source region; a p-type body region, and a gate electrode which is capacitively coupled to a portion of the body region; an n-type drain region; an n-type drift region, which is laterally interposed between the drain region and the body region in an electrical relation such that, when the gate electrode has a positive voltage which inverts part of the body region to form a channel therein, electrons can flow from the source region, through the channel, laterally through the drift region, and to the drain region; wherein the source, body, drift, and drain regions are all located within a mass of p-type semiconductor material; and p-type charge balancing regions which laterally flank the drift region, and which are laterally flanked by insulating trenches which include immobile positive electrostatic charge; and wherein, when reverse bias is present between the source and drain regions, the negative space charge of depleted portions of the p-type charge balancing regions, will at least partially balance the positive space charge of depleted portions of the drift region in combination with the fixed charge in the trenches According to some but not necessarily all embodiments, there is provided a method for switching electrical power by driving the gate of a lateral power semiconductor device which comprises, on a single die, multiple lateral power transistors which each include: a first-conductivity-type source region; a second-conductivity-type body region, and a gate electrode which is capacitively coupled to a portion of the body region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, laterally through the drift region, to the drain region; wherein the source, body, drift, and drain regions are all located within a mass of second-conductivity-type semiconductor material; and second-conductivity-type charge balancing regions which laterally flank the drift region, and which are laterally flanked by insulating trenches; wherein, when reverse bias is present between the source and drain regions, the space charge of depleted portions of the second-conductivity-type charge balancing regions and of the upper region will at least partially balance the space charge of depleted portions of the drift region; and wherein the respective drain regions of the multiple transistors are isolated from each other by intervening portions of the second-conductivity-type mass of semiconductor material.

According to some but not necessarily all embodiments, there is provided a method for switching electrical power by driving the gate of a lateral power semiconductor device which comprises: a first-conductivity-type source region; a second-conductivity-type body region, and a gate electrode which is capacitively coupled to a portion of the body region; a first-conductivity-type drain region; a first-conductivity-type drift region, which is laterally interposed between the drain region and the body region in an electrical relation such that, when the gate electrode has a voltage which inverts part of the body region to form a channel therein, majority carriers can flow from the source region, through the channel, through the drift region, to the drain region; wherein the source, body, drift, and drain regions are all located within a second-conductivity type well, which overlies a first-conductivity-type buried layer, which in turn overlies a mass of second-conductivity-type semiconductor material; second-conductivity-type charge balancing regions which laterally flank the drift region, and which are laterally flanked by insulating trenches; and wherein, when reverse bias is present between the source and drain regions, the space charge of depleted portions of the second-conductivity-type charge balancing regions will at least partially balance the space charge of depleted portions of the drift region.

According to some but not necessarily all embodiments, there is provided a method for switching electrical power by driving the gate of a lateral power semiconductor device with bipolar conduction which comprises: a first-conductivity-type emitter region; a second-conductivity-type body region, and a gate electrode which is capacitively coupled to a portion of the body region; a second-conductivity-type collector region; a first-conductivity-type drift region, which is laterally interposed between the collector region and the body region in an electrical relation such that, when the gate electrode has a voltage which inverts part of the body region to form a channel therein, majority carriers can flow from the emitter region, through the channel, through the drift region, to the collector region; and minority carriers are injected from the collector region through the drift region to the emitter region; and second-conductivity-type charge balancing regions which laterally flank the drift region, and which are laterally flanked by insulating trenches; wherein, when reverse bias is present between the emitter and collector regions, the space charge of depleted portions of the second-conductivity-type charge balancing regions will at least partially balance the space charge of depleted portions of the drift region.

According to some but not necessarily all embodiments, there is provided methods and systems for lateral power devices, and methods for operating them, in which charge balancing is implemented in a new way. In a first inventive teaching, the lateral conduction path is laterally flanked by regions of opposite conductivity type which are self-aligned to isolation trenches which define the surface geometry of the drift region. In a second inventive teaching, which can be used separately or in synergistic combination with the first teaching, the drain regions are self-isolated. In a third inventive teaching, which can be used in synergistic combination with the first and/or second teachings, the source regions are also isolated from each other. In a fourth inventive teaching, the lateral conduction path is also overlain by an additional region of opposite conductivity type.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, it should be noted that the deep N+ sinker can be deeper or shallower than N-Drift layer. Furthermore, the N+ sinker can be formed by using a deep trench filled with conducting material such as tungsten and surrounded by a n+ layer formed by an phosphorus or arsenic implant.

For example, it should also be noted that conventional techniques such as Local Field Oxidation (LOCOS) can be used to form the thick field oxide.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way.

While only n-channel MOSFETs are shown here, p-channel MOSFETs are realizable with this invention simply by changing the polarity of the permanent charge (if any) and swapping n-type and p-type regions in any of the figures. This is well known by those of ordinary skill in the art.

Additionally while only MOSFETs and IGBTs are shown, many other device structures are implementable using this invention including diodes, thyristors, JFETs, BJTs, and the like.

It should be noted that the deep N+ sinker can be deeper or shallower than N-Drift layer. Furthermore, the N+ sinker can alternatively be formed by using a deep trench filled with conducting material such as tungsten and surrounded by a n+ layer formed by an phosphorus or arsenic implant.

In some embodiments, the fraction of the width used for the balancing regions 112 depends on the ratio of doping concentration between balancing regions 112 and the drift region 122.

It should also be understood that numerous combinations of the above embodiments can be realized.

Those of ordinary skill in the relevant fields of art will recognize that other inventive concepts may also be directly or inferentially disclosed in the foregoing. NO inventions are disclaimed.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous):

1. A lateral power semiconductor device, comprising:
   a first-conductivity-type source region;
   a second-conductivity-type body region, and a gate electrode which is capacitively coupled to a portion of the body region which is laterally adjacent to the source region;
   a first-conductivity-type drain region;
   a first-conductivity-type drift region, which is laterally interposed between the drain region and the body region in an electrical relation such that, when the gate electrode has a voltage which inverts part of the body region to form a channel therein, majority carriers can flow from the source region, through the channel, through the drift region, to the drain region;
   wherein the source, body, drift, and drain regions are all located near a single surface of a second-conductivity-type semiconductor substrate, to permit predominantly lateral flow of carriers when a channel is present; and
   second-conductivity-type charge balancing regions which laterally confine a portion of the drift region, and which are laterally flanked by insulating trenches;
   wherein, when the gate is not inverting the body, and reverse bias is present between the source and drain regions, the drift region, and the charge balancing regions adjacent to the drift region, will be substantially depleted before breakdown occurs.

2. The lateral power semiconductor device of claim 1, wherein the first conductivity type is n-type, and the second conductivity type is p-type.

3. The lateral power semiconductor device of claim 1, wherein the semiconductor substrate is monolithic silicon.

4. The lateral power semiconductor device of claim 1, wherein the semiconductor substrate is a semiconductor-on-insulator structure.

5. The lateral power semiconductor device of claim 1, wherein the gate is insulated from the body region by a thin dielectric layer.

6. The lateral power semiconductor device of claim 1, wherein the drift region overlaps the entire width of the gate electrode at an interface between the body region and the drift region.

7. A lateral power semiconductor device, comprising:
   a first-conductivity-type source region;
   a second-conductivity-type body region, and a gate electrode which is capacitively coupled to a portion of the body region;
   a first-conductivity-type drain region;
   a first-conductivity-type drift region, which is laterally interposed between the drain region and the body region in an electrical relation such that, when the gate electrode has a voltage which inverts part of the body region to form a channel therein, majority carriers can flow from the source region, through the channel, through the drift region, to the drain region;
   wherein the source, body, drift, and drain regions are all located within a mass of second-conductivity-type semiconductor material;

second-conductivity-type charge balancing regions which laterally flank the drift region, and which are laterally flanked by insulating trenches; and first-conductivity-type bottom regions below the trenches;

wherein, when reverse bias is present between the source and drain regions, the space charge of depleted portions of the second-conductivity-type charge balancing regions will at least partially balance the space charge of depleted portions of the drift region, and the space charge of depleted portions of the first-conductivity-type bottom regions will at least partially balance the space charge of depleted portions of the second-conductivity-type semiconductor mass.

8. The lateral power semiconductor device of claim 7, wherein the first conductivity type is n-type, and the second conductivity type is p-type.

9. The lateral power semiconductor device of claim 7, wherein the semiconductor substrate is monolithic silicon.

10. The lateral power semiconductor device of claim 7, wherein the charge balancing regions are laterally flanked by insulating trenches.

11. The lateral power semiconductor device of claim 7, wherein the semiconductor substrate is a semiconductor-on-insulator structure.

12. The lateral power semiconductor device of claim 7, wherein the gate is insulated from the body region by a thin dielectric layer.

13. The lateral power semiconductor device of claim 7, wherein the drift region overlaps a total width of the gate electrode at an interface between the body region and the drift region.

14. A lateral power semiconductor device, comprising:
a first-conductivity-type source region;
a second-conductivity-type body region, and a gate electrode which is capacitively coupled to a portion of the body region;
a first-conductivity-type drain region;
a first-conductivity-type drift region, which is laterally interposed between the drain region and the body region in an electrical relation such that, when the gate electrode has a voltage which inverts part of the body region to form a channel therein, majority carriers can flow from the source region, through the channel, laterally through the drift region, to the drain region;

wherein the source, body, drift, and drain regions are all located within a mass of second-conductivity-type semiconductor material;

second-conductivity-type charge balancing regions which laterally flank the drift region, and which are laterally flanked by insulating trenches; and a second-conductivity-type upper region which overlies the drift region;

wherein, when reverse bias is present between the source and drain regions, the space charge of depleted portions of the second-conductivity-type charge balancing regions and of the upper region will at least partially balance the space charge of depleted portions of the drift region.

15. The lateral power semiconductor device of claim 14, wherein the first conductivity type is n-type, and the second conductivity type is p-type.

16. The lateral power semiconductor device of claim 14, wherein the semiconductor substrate is monolithic silicon.

17. The lateral power semiconductor device of claim 14, wherein the charge balancing regions are laterally flanked by insulating trenches.

18. The lateral power semiconductor device of claim 14, wherein the semiconductor substrate is a semiconductor-on-insulator structure.

19. The lateral power semiconductor device of claim 14, wherein the gate is insulated from the body region by a thin dielectric layer.

20. The lateral power semiconductor device of claim 14, wherein the drift region overlaps a total width of the gate electrode at an interface between the body region and the drift region.

* * * * *